United States Patent
Tsai et al.

(10) Patent No.: US 9,606,436 B2
(45) Date of Patent: Mar. 28, 2017

(54) PHOTOSENSITIVE RESIN COMPOSITION AND APPLICATION THEREOF

(71) Applicant: CHI MEI CORPORATION, Tainan (TW)

(72) Inventors: Yu-Jie Tsai, Tainan (TW); I-Kuang Chen, New Taipei (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 15/231,771

(22) Filed: Aug. 8, 2016

(65) Prior Publication Data
US 2017/0052446 A1    Feb. 23, 2017

(30) Foreign Application Priority Data

Aug. 19, 2015    (TW) .............................. 104127031 A

(51) Int. Cl.
| | |
|---|---|
| G03F 7/029 | (2006.01) |
| G03F 7/033 | (2006.01) |
| G03F 7/075 | (2006.01) |
| G03F 7/16 | (2006.01) |
| G03F 7/20 | (2006.01) |
| G03F 7/32 | (2006.01) |
| G03F 7/40 | (2006.01) |

(52) U.S. Cl.
CPC .......... *G03F 7/0751* (2013.01); *G03F 7/0754* (2013.01); *G03F 7/162* (2013.01); *G03F 7/2002* (2013.01); *G03F 7/32* (2013.01); *G03F 7/40* (2013.01)

(58) Field of Classification Search
None
See application file for complete search history.

(56) References Cited

U.S. PATENT DOCUMENTS

| | | | | |
|---|---|---|---|---|
| 4,497,890 A | * | 2/1985 | Helbert ...................... | G03F 7/11 257/E21.259 |
| 2007/0075309 A1 | * | 4/2007 | Zhong ................... | G03F 7/0382 257/40 |
| 2008/0261145 A1 | * | 10/2008 | Zhong ................... | G03F 7/0045 430/199 |
| 2011/0281967 A1 | * | 11/2011 | Krawiec .............. | C09D 175/16 522/96 |
| 2014/0124898 A1 | * | 5/2014 | Malhotra ............ | H01L 29/0676 257/618 |

FOREIGN PATENT DOCUMENTS

| | | |
|---|---|---|
| EP | 0 637 902 A1 * | 2/1995 |
| JP | 2004240241 A | 8/2004 |
| JP | 2010054561 A | 3/2010 |

OTHER PUBLICATIONS

English translation of JP, 2004-240241, A (2004) from machine translation from AIPN Japan Patent Office National Center for Industrial Property Information and Training, generated Jan. 3, 2017 32 pages.*

English translation of JP, 2010-54561 a, A (2010) from machine translation from AIPN Japan Patent Office National Center for Industrial Property Information and Training, generated Jan. 3, 2017, 20 pages.*

* cited by examiner

*Primary Examiner* — Cynthia Hamilton
(74) *Attorney, Agent, or Firm* — CKC & Partners Co., Ltd.

(57) ABSTRACT

A photosensitive resin composition includes an alkali-soluble resin (A), a compound having an unsaturated vinyl group (B), a photo initiator (C), solvent (D) and a silane compound (E) having a structure shown as formula (I):

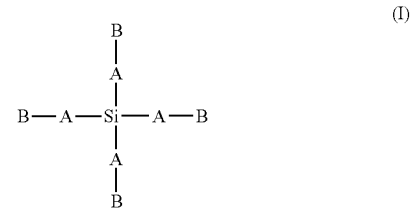

in the formula (I), A individually and independently represents a single bond, an alkylene group, or an arylene group, B individually and independently represents an organic group having diphenyl phosphine, hydrogen atom, an alkyl group, an aryl group, or —OR, in which R is a C1-C6 alkyl group or a phenyl group, at least one B is the organic group having diphenyl phosphine and at least one B is —OR. When B is —OR, A connected to B is the single bond. A film formed by the photosensitive resin composition has good refractivity and adhesivity to molybdenum.

10 Claims, No Drawings

PHOTOSENSITIVE RESIN COMPOSITION AND APPLICATION THEREOF

RELATED APPLICATIONS

This application claims priority to Taiwan Application Serial Number TW 104127031, filed Aug. 19, 2015, which is herein incorporated by reference.

BACKGROUND

Field of Invention

The present invention relates to a photosensitive resin composition and its application thereof. More particularly, the present invention relates to a film formed by the photosensitive resin composition and its application thereof. The film has a good refractivity and adhesivity to molybdenum (Mo).

Description of Related Art

In the manufacturing process of a liquid crystal display component, forming a protective film on a substrate is an important step. Demanding procedures under harsh conditions are required for manufacturing a liquid crystal display component or a solid-state imaging device, etc. For example, local high temperature occurs when processing by infusion with an acid solvent or alkaline solvent on the surface of substrate or by sputtering to form a wiring electrode layer. Thus, the protective film is laid on these components to prevent them from damage. Nowadays, the protective film is generally formed on the substrate by subjecting a photosensitive resin to processes of coating, exposure and developing, etc.

To enable the protective film to resist the aforementioned harsh conditions of the processes, high transparency, high surface hardness and smoothness are required, along with an excellent adhesivity between the protective film and substrate. Moreover, good resistance to water, solvents, acid, alkali and the like of the protective film is also required. In the aforementioned characteristics, since the protective film is formed on a color filter or a substrate, the requirement of high transparency is critical. If the transparency of the protective film is poor, when the protective film is applied to the liquid crystal display element, the brightness of the liquid crystal display element is insufficient, and the display quality of the liquid crystal display element is impacted.

To improve the transparency of the protective film, Japanese Patent Publication No. 2010-054561 disclosed a photosensitive composition for a protective film, comprising: an alkali-soluble bonding resin (A), a compound having a vinyl unsaturated group (B), a photoinitiator (C), and a solvent (D), in which the bonding equivalence of the unsaturated bond in the compound having a vinyl unsaturated group (B) is between 90 and 450 g/eq, and the amount of unsaturated double bond of a single compound is between 2 and 4 in the compound having a vinyl unsaturated group (B). A weight average molecular weight of the alkali-soluble bonding resin (A) is between 10,000 and 20,000.

Additionally, Japanese Patent Publication No. 2004-240241 has disclosed a photosensitive composition comprising: a copolymer (A), a polymer having a vinyl unsaturated group (B) and a photoinitiator (C). The copolymer (A) is polymerized by an unsaturated carboxyl (anhydride) having a vinyl group, a compound having a vinyl unsaturated group containing an epoxy group and other compounds having a vinyl unsaturated group. The photoinitiator (C) is 2-butanedione-[-4-methylthio benzene]-2-(O-oxime acetate), 1,2-butanedione-1-(-4-morpholino phenyl)-2-(O-benzoyl oxime), 1,2-octadione-1-[4-thiophenyl benzene]-2 [O-(4-methyl benzoyl) oxime] or the like. However, the film formed by the photosensitive resin composition is unable to satisfy increasing requirements of refractivity and adhesivity to molybdenum.

Therefore, how to achieve the requirements of the refractivity and the adhesivity to molybdenum at the same time is a goal in the technical field of the present invention.

SUMMARY

Therefore, one of an aspect of the present invention is to provide a photosensitive resin composition.

Another aspect of the present invention is to provide a film formed by the photosensitive resin composition, and having a good refractivity and adhesivity to molybdenum.

The other aspect of the present invention is to provide a device including the aforementioned film.

According to the aspects of the present invention, a photosensitive resin composition is provided. The photosensitive resin composition comprises an alkali-soluble resin (A), a compound having a vinyl unsaturated group (B), a photoinitiator (C), a solvent (D) and a silane compound (E), in which the silane compound (E) includes a silane compound (E-1). The details are described as below.

PHOTOSENSITIVE RESIN COMPOSITION

An Alkali-Soluble Resin (A)

A Resin Having an Unsaturated Group (A-1)

The alkali-soluble resin (A) includes a resin having an unsaturated group (A-1). The resin having an unsaturated group (A-1) is prepared by polymerizing a mixture, in which the mixture includes an epoxy compound having at least two epoxy groups (a-1-1) and a compound having at least one carboxyl group and at least one vinyl unsaturated group (a-1-2). Preferably, the mixture can selectively include a carboxylic anhydride compound (a-1-3) and/or a compound having an epoxy group (a-1-4).

In one example of the present invention, the epoxy compound having at least two epoxy groups (a-1-1) of the resin having an unsaturated group (A-1) may have a structure of formula (a-I):

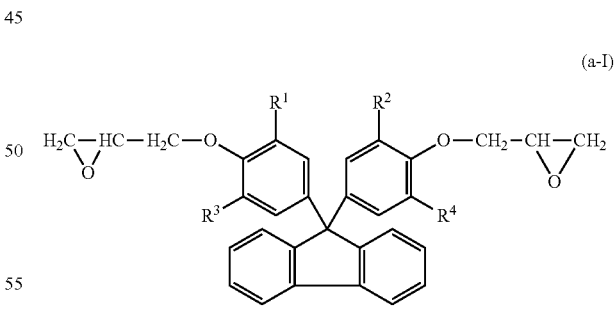

in the formula (a-I), $R^1$, $R^2$, $R^3$ and $R^4$ individually and independently represent a hydrogen atom, a halogen atom, an alkyl group of 1 to 5 carbons, an alkoxy group of 1 to 5 carbons, an aryl group of 6 to 12 carbons or an aralkyl group of 6 to 12 carbons.

The epoxy compound having at least two epoxy groups (a-1-1) having a structure of the formula (a-I) can include but is not limited to a bisphenol fluorene compound having epoxy groups which is obtained by reacting bisphenol fluorine with epihalohydrin.

For examples, the aforementioned bisphenol fluorene can include but is not limited to 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, and the like.

The aforementioned epihalohydrin may include but is not limited to epichlorohydrin, epibromohydrin or the like.

The aforementioned bisphenol fluorine having epoxy groups may include but is not limited to (1) commercial products, manufactured by Nippon Steel Chemical Co. Ltd., and the trade names are ESF-300 or the like; (2) products manufactured by Osaka Gas Co. Ltd., and the trade names are PG-100, EG-210 or the like; (3) products manufactured by S.M.S. Technology Co. Ltd., and the trade names are SMS-F9PhPG, SMS-F9CrG, SMS-F914PG or the like.

In the other example of the present invention, the epoxy compound having at least two epoxy groups (a-1-1) of the resin having the unsaturated group (A-1) may have a structure of formula (a-II):

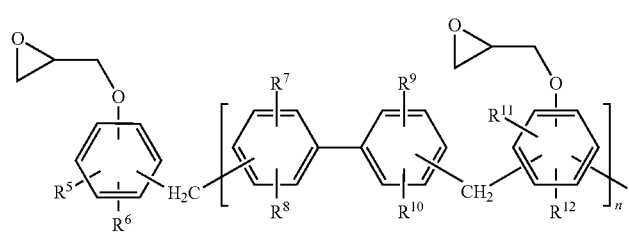

(a-II)

in the formula (a-II), $R^5$ to $R^{18}$ individually and independently represent a hydrogen atom, a halogen atom, an alkyl group of 1 to 8 carbons, an aryl group of 6 to 15 carbons, and the n represents an integer from 0 to 10.

The epoxy compound having at least two epoxy groups (a-1-1) having a structure of the formula (a-II) is obtained by reacting a compound with the structure shown in formula (a-II-1) with epihalohydrin in the presence of alkali metal hydroxides:

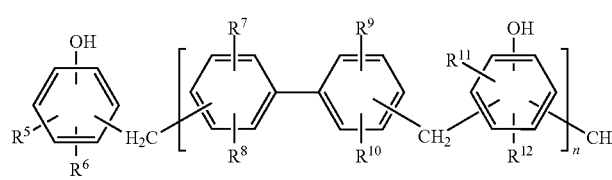

(a-II-1)

in the formula (a-II-1), $R^5$ to $R^{18}$ and n have the same definitions as above, therefore it is not repeated here.

Moreover, in presence of an acid catalyst, the epoxy compound having at least two epoxy groups (a-1-1) with a structure of the formula (a-II) is obtained by the following steps. A compound having a structure of the formula (a-II-2) is reacted with phenol compounds by a condensation reaction, and thus the aforementioned compound having a structure of the formula (a-II-1) is obtained. And then, an excess amount of epihalohydrin are added to subject to a dehydro-halogenation reaction, so as to obtain the epoxy compound having at least two epoxy groups (a-1-1) with a structure of formula (a-II).

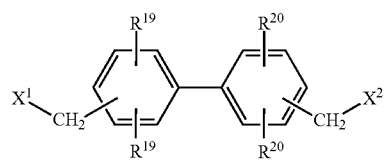

(a-II-2)

in formula (a-II-2), $R^{19}$ and $R^{20}$ can be the same or different, and $R^{19}$ and $R^{20}$ independently represent a hydrogen atom, a halogen atom, an alkyl group of 1 to 8 carbons, an aryl group of 6 to 15 carbons; $X^1$ and $X^2$ can be the same or different, and $X^1$ and $X^2$ independently represent a halogen atom, an alkyl group of 1 to 6 carbons or an alkoxy group of 1 to 6 carbons. Preferably, the halogen atom represents chlorine or bromine. The alkyl group can be a methyl group, an ethyl group, or a t-butyl group. The alkoxy group can be a methoxy group or an ethoxy group.

Specific examples of the aforementioned phenol compounds can be phenol, cresol, ethylphenol, n-propylphenol, isobutylphenol, t-butylphenol, octylphenol, nonylphenol, xylenol, methylbutylphenol, di-t-butylphenol, vinylphenol, propenyiphenol, ethynylphenol, cyclopentylphenol, cyclohexylphenol, cyclohexylcresol or the like. The phenol compounds can be used alone or in a combination of two or more.

Based on an amount of the compound having a structure of the formula (a-II-2) as 1 mole, an amount of phenol compounds is 0.5 moles to 20 moles, and preferably is 2 moles to 15 moles.

Specific examples of the aforementioned acid catalyst may be hydrochloric acid, sulfuric acid, p-toluenesulfonic acid, oxalic acid, boron trifluoride, anhydrous aluminium chloride, zinc chloride and the like. Preferably, the acid catalyst is selected from p-toluenesulfonic acid, sulfuric acid or hydrochloric acid. The acid catalyst can be used alone or in a combination of two or more.

In addition, there is no specific limitation to the amount of the acid catalyst. Preferably, based on the amount of the compound having a structure of formula (a-II-2) as 100 wt %, an amount of the acid catalyst is preferably 0.1 wt % to 30 wt %.

The aforementioned condensation reaction can be performed in the absence of solvents or in the presence of organic solvents. Specific examples of the organic solvents may be toluene, xylene, methyl isobutyl ketone or the like. The organic solvents can be used alone or in a combination of two or more.

Based on a total amount of the compound having a structure of the formula (a-II-2) and the amount of the phenol as 100 wt %, an amount of the organic solvent is 50 wt % to 300 wt %, and is preferably 100 wt % to 250 wt %. Besides, the condensation reaction is performed at 40° C. to 180° C. for 1 hour to 8 hours.

After the condensation reaction is complete, a neutralization treatment or a rinsing treatment can be performed. The neutralization treatment is to adjust the pH value of the solution to 3 to 7, and is preferably 5 to 7. The rinsing treatment is performed with a neutralizing agent, and the neutralizing agent is a basic compound, for example, alkali metal hydroxides such as sodium hydroxide, potassium hydroxide and the like; alkaline earth metal hydroxides such as calcium hydroxide, magnesium hydroxide and the like; organic amines such as diethylene triamine, triethylene tetramine, aniline, phenylene diamine and the like; and ammonia, sodium dihydrogen phosphate and other compounds. The rinsing treatment can be performed in a commonly used manner. For example, the reacted solution is repeatedly extracted by adding an aqueous solution containing the neutralizing agent. After the neutralization or rinsing treatment is complete, unreacted phenols and solvents can be removed via distillation at a reduced pressure, and then concentrated to obtain the compound having a structure of the formula (a-II-1).

An example of the aforementioned epihalohydrin may be 3-chloro-1,2-epoxypropane, 3-bromo-1,2-epoxypropane or a combination thereof. Before the aforementioned dehydrohalogenation reaction is performed, alkaline metal hydroxides such as sodium hydroxide, potassium hydroxide and the like can be added prior to or during the dehydrohalogenation reaction. The aforementioned dehydrohalogenation is performed at 20° C. to 120° C. for 1 hour to 10 hours.

In one embodiment, the alkaline metal hydroxides added in the dehydrohalogenation reaction can be an aqueous solution. In this embodiment, when the alkaline metal hydroxide aqueous solution is continuously added to a dehydrohalogenation reaction system, water and epihalohydrin can be continuously distilled at atmospheric pressure or at a reduced pressure, thereby separating and removing the water, and the epihalohydrin can be continuously refluxed into the reaction system at the same time.

Before the aforementioned dehydrohalogenation reaction is performed, quaternary ammonium salts, such as tetramethyl ammonium chloride, tetramethyl ammonium bromide, trimethyl benzyl ammonium chloride and the like can be added as a catalyst, and reacted at 50° C. to 150° C. for 1 hour to 5 hours. Then, alkaline metal hydroxide or an aqueous solution thereof is added, and the dehydrohalogenation reaction is performed at 20° C. to 120° C. for 1 hour to 10 hours.

Based on a total equivalent hydroxyl groups in the compound having a structure of the formula (a-II-1) as 1 equivalent, the amount of the epihalohydrin is 1 equivalent to 20 equivalents, and is preferably 2 equivalents to 10 equivalents. Based on the total equivalent hydroxyl groups in the compound with the structure in the formula (a-II-1) as 1 equivalent, an amount of the alkaline metal hydroxide that was added to the dehydrohalogenation reaction is 0.8 equivalents to 15 equivalents, and preferably is 0.9 equivalents to 11 equivalents.

In addition, to perform the dehydrohalogenation reaction smoothly, polar aprotic solvents such as dimethyl sulfone, dimethyl sulfoxide and the like can also be added in addition to alcohols such as methanol, ethanol and the like, to perform the reaction. When the alcohol is used, based on an amount of the epihalohydrin as 100 wt %, the amount of alcohol can be 2 wt % to 20 wt %, and is preferably 4 wt % to 15 wt %. When the polar aprotic solvent is used, based on the amount of the epihalohydrin as 100 wt %, the amount of polar aprotic solvent can be 5 wt % to 100 wt %, and is preferably 10 wt % to 90 wt %.

After the dehydrohalogenation reaction is completed, a rinse treatment can be optionally performed. Afterwards, the epihalohydrin, the alcohol, the polar aprotic solvent and the like are removed by a heating treatment at a reduced pressure. The heating treatment at the reduced pressure can be performed at 110° C. to 250° C. and a pressure less than 1.3 kPa (10 mmHg).

To prevent the formed epoxy resin from containing hydrolysable halogens, solvents such as toluene, methyl isobutyl ketone and the like, and alkali metal hydroxide solutions such as sodium hydroxide, potassium hydroxide and the like can be added to the solution after the dehydrohalogenation reaction to perform the dehydrohalogenation reaction again. During the dehydrohalogenation reaction, based on the total equivalent of hydroxyl groups in the compound having a structure of formula (a-II-1) as 1 equivalent, the amount of alkali metal hydroxide is 0.01 moles to 0.3 moles, and is preferably 0.05 moles to 0.2 moles. In addition, the dehydrohalogenation reaction is performed at 50° C. to 120° C. for 0.5 hour to 2 hours.

After the dehydrohalogenation reaction is completed, salts can be removed by performing a filtration step, a rinse step and the like. In addition, solvents such as toluene, methyl isobutyl ketone or the like can be removed by a heating treatment at a reduced pressure, thereby obtaining an epoxy compound having at least two epoxy groups (a-1-1) having a structure of formula (a-II). The aforementioned epoxy compound having at least two epoxy groups (a-1-1) having a structure of formula (a-II) can include but is not limited to commercially available products manufactured by Nippon Kayaku Co. Ltd., and the trade names are NC-3000, NC-3000H, NC-3000S, NC-3000P and the like.

In one example of the present invention, the aforementioned compound having at least one carboxyl group and at least one vinyl unsaturated group (a-1-2) of the resin having an unsaturated vinyl group (A-1) is selected from the group consisting of the following subgroups (1) to (3): (1) acrylic acid, methacrylic acid, 2-methacryloyloxyethyl butanedioic acid, 2-methacryloyloxybutyl butanedioic acid, 2-methacryloyloxyethyl hexanedioic acid, 2-methacryloyloxybutyl hexanedioic acid, 2-methacryloyloxyethyl hexahydrophthalic acid, 2-methacryloyloxyethyl maleic acid, 2-methacryloyloxypropyl maleic acid, 2-methacryloyloxybutyl maleic acid, 2-methacryloyloxypropyl butanedioic acid, 2-methacryloyloxypropyl hexanedioic acid, 2-methacryloyloxypropyl tetrahydrophthalic acid, 2-methacryloyloxypropyl phthalic acid, 2-methacryloyloxybutyl phthalic acid or 2-methacryloyloxybutyl hydrophthalic acid; (2) a compound obtained by reacting (methyl)acrylate esters having hydroxyl group(s) with a dicarboxylic acid compound, in which the dicarboxylic acid compound may include but not limited to hexanedioic acid, butanedioic acid, maleic acid, and phthalic acid; (3) a hemiester compound obtained by reacting (methyl)acrylate having hydroxyl group(s) with a carboxylic acid anhydride compound. The aforementioned (methyl)acrylate having hydroxyl group(s) may include but is not limited to (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl)methacrylate, pentaerythritol triacrylate and the like. The aforementioned carboxylic acid anhydride compounds can be the same as the carboxylic anhydride compound (a-1-3) in the resin having an unsaturated group (A-1), therefore it is not repeated here.

As described above, the resin having an unsaturated group (A-1) can selectively comprise the carboxylic anhydride compound (a-1-3) and/or the epoxy compound (a-1-4). The aforementioned carboxylic anhydride compound (a-1-3) can be selected from the group consisting of the following subgroups (1) to (2): (1) dicarboxylic acid anhydride compounds such as butanedioic anhydride, maleic anhydride, itaconic anhydride, phthalic anhydride, tetrahydrophthalic anhydride, hexahydrophthalic anhydride, methyltetrahydrophthalic anhydride, methylhexahydrophthalic anhydride, methyl endo-methylene tetrahydrophthalic anhydride, chlorendic anhydride, pentanedioic anhydride, 1,3-dioxoisobenzofuran-5-carboxylic anhydride and the like; and (2) tetracarboxylic acid anhydride compounds such as benzophenone tetracarboxylic dianhydride (BTDA), diphenyl tetracarboxylic dianhydride, diphenyl ether tetracarboxylic acid dianhydride and the like.

The aforementioned compound having an epoxy group (a-1-4) can be selected from the group consisting of glycidyl methacrylate, 3,4-epoxycyclohexyl methacrylate, glycidyl ether compounds having unsaturated group(s), unsaturated compounds having epoxy group(s) or a combination thereof. The aforementioned glycidyl ether compounds having unsaturated group(s) may include but not limited to commercially available products such as Denacol EX-111, Denacol EX-121, Denacol EX-141, Denacol EX-145, Denacol EX-146, Denacol EX-171, Denacol EX-192 and the like manufactured by Nagase ChemteX Corporation.

The aforementioned resin having an unsaturated group (A-1) can be obtained by polymerization of the epoxy compound having at least two epoxy groups (a-1-1) of the formula (a-I) with the compound having at least one carboxyl group and at least one vinyl unsaturated group (a-1-2) to form a reacted product having hydroxyl group(s), and then reacting the reacted product with the carboxylic anhydride compound (a-1-3). Preferably, based on the total equivalent hydroxyl groups of the reacted product having hydroxyl group(s) as 1 equivalent, the equivalent anhydride groups in the carboxylic anhydride compound (a-1-3) is preferably 0.4 equivalents to 1 equivalent, and more preferably is 0.75 equivalents to 1 equivalent. When a plurality of the carboxylic anhydride compounds (a-1-3) is applied, it can be added sequentially or simultaneously in the reaction. Preferably, when a dicarboxylic acid anhydride compound and tetracarboxylic acid anhydride compound are used as the carboxylic anhydride compound (a-1-3), the molar ratio of the dicarboxylic acid anhydride compound and the tetracarboxylic acid anhydride compound is 1/99 to 90/10, and more preferably is 5/95 to 80/20. In addition, the aforementioned reaction can be performed at a 50° C. to 130° C.

The resin having an unsaturated group (A-1) can be obtained by reacting the epoxy compound having at least two epoxy groups (a-1-1) of the formula (a-II) with the compound having at least one carboxyl group and at least one vinyl unsaturated group (a-1-2) to form an reacted product having hydroxyl group(s), and then the reacted product is subjected to a polymerization reaction by adding the carboxylic anhydride compound (a-1-3) and/or the compound having an epoxy group (a-1-4). Preferably, based on the total equivalent epoxy groups of the epoxy compound having at least two epoxy groups (a-1-1) of formula (a-II) as 1 equivalent, the acid value equivalent of the compound having at least one carboxyl group and at least one vinyl unsaturated group (a-1-2) is preferably 0.8 equivalent to 1.5 equivalent, and more preferably is 0.9 equivalent to 1.1 equivalent. Based on the hydroxyl groups in the reacted product having hydroxyl group(s) as 100 mole %, the amount of the anhydride compound (a-1-3) is 10 mole % to 100 mole %, preferably is 20 mole % to 100 mole %, and more preferably is 30 mole % to 100 mole %.

When the aforementioned resin having an unsaturated group (A-1) is prepared, alkaline compounds are usually added to the reacting solution as a reacting catalyst to accelerate the reaction. The reacting catalyst can be used alone or in a combination of two or more. The aforementioned reacting catalyst may include but is not limited to triphenyl phosphine, triphenyl stibine, triethylamine, triethanolamine, tetramethylammonium chloride, benzyltriethylammonium chloride and the like. Preferably, based on the total amount of the epoxy compound having at least two epoxy groups (a-1-1) and the compound having at least one carboxyl group and at least one vinyl unsaturated group (a-1-2) as 100 parts by weight, the amount of the reacting catalyst is preferably 0.01 parts by weight to 10 parts by weight, and more preferably is 0.3 parts by weight to 5 parts by weight.

In addition, to control the degree of polymerization, a polymerization inhibitor is usually added into the reacting solution. The aforementioned polymerization inhibitor may include but is not limited to methoxyphenol, methylhydroquinone, hydroquinone, 2,6-di-t-butyl-p-cresol, phenothiazine and the like. The aforementioned polymerization inhibitor may be used alone or in a combination of two or more. Based on the total amount of the epoxy compound having at least two epoxy groups (a-1-1) and the compound having at least one carboxyl group and at least one vinyl unsaturated group (a-1-2) as 100 parts by weight, the amount of the polymerization inhibitor is preferably 0.01 parts by weight to 10 parts by weight, and more preferably is 0.1 parts by weight to 5 parts by weight.

When the resin having an unsaturated group (A-1) is prepared, a polymerization solvent can be used if necessary. Specific examples of the aforementioned polymerization solvent are alcohol compounds such as ethanol, propanol, isopropanol, butanol, isobutanol, 2-butanol, hexanol, ethylene glycol or the like; ketone compounds such as methyl ethyl ketone, cyclohexanone or the like; aromatic hydrocarbon compounds such as toluene, xylene or the like; cellosolve compounds such as cellosolve, butyl cellosolve or the like; carbitol compounds such as carbitol, butyl carbitol or the like; propylene glycol alkyl ether compounds such as propylene glycol monomethyl ether or the like; poly(propylene glycol) alkyl ether compounds such as di(propylene glycol) methyl ether or the like; acetate ester compounds such as ethyl acetate, butyl acetate, ethylene glycol monoethyl ether acetate, propylene glycol methyl ether acetate or the like; alkyl lactate compounds such as ethyl lactate, butyl lactate or the like; or dialkyl glycol ether compounds. The aforementioned polymerization solvent may be used alone or in a combination of two or more. Furthermore, the acid value of the resin having an unsaturated group (A-1) is preferably 50 mgKOH/g to 200 mgKOH/g, and more preferably is 60 mgKOH/g to 150 mgKOH/g.

An average weight molecular weight of the alkali-soluble resin (A-1) is generally 1,200 to 15,000, preferably is 1,500 to 13,000, and more preferably is 1,800 to 10,000.

Based on the alkali-soluble resin (A) as 100 parts by weight, the amount of the aforementioned resin having an unsaturated group (A-1) is 30 parts by weight to 100 parts by weight, preferably is 50 parts by weight to 100 parts by weight, and more preferably is 70 parts by weight to 100 parts by weight. If the alkali-soluble resin (A) of the photosensitive resin composition contains the resin having an unsaturated group (A-1), the refractivity of the photosensitive resin composition can be improved.

Though not willing to be limited by a theory, it is believed that the refractivity is proportional to polarity of a molecule. An aromatic ring has a molecule structure with high polarity, thus the refractivity of the resin having an unsaturated group (A-1) may be increased due to the aromatic ring structure.

Alkali-Soluble Resins (A-2)

Preferably, the alkali-soluble resin (A) includes alkali-soluble resin (A-2).

A term of "(meth)acrylic acid" used in the present invention represents acrylic acid and/or methacrylic acid; a term of "(meth)acryloyl" represents acryloyl and/or methacryloyl; a term of "(meth)acrylate" represents acrylate and/or methacrylate.

The alkali-soluble resin (A-2) is a resin that can be soluble in an alkaline aqueous solution without being limited to any specific structure. Preferably, the alkali-soluble resin (A-2) is a resin containing a carboxylic group, a phenol-novolac resin and the like. More preferably, the alkali-soluble resin (A) is copolymerized from a compound (a1) of unsaturated carboxylic acid or unsaturated carboxylic anhydride, an unsaturated compound containing epoxy group(s) (a2) and/or other unsaturated compounds (a3) in a solvent in the presence of an appropriate polymerization initiator.

When the alkali-soluble resin (A-2) is copolymerized from the compound (a1) of unsaturated carboxylic acid or unsaturated carboxylic anhydride, the unsaturated compound containing epoxy group(s) (a2) and/or other unsaturated compounds (a3), based on an amount of the compounds used to polymerize the alkali-soluble resin (A-2) as 100 parts by weight, an amount of the compound (a1) of unsaturated carboxylic acid or unsaturated carboxylic anhydride is 5 parts by weight to 50 parts by weight, preferably is 8 parts by weight to 45 parts by weight, and more preferably is 10 parts by weight to 40 parts by weight. The compound (a1) of unsaturated carboxylic acid or unsaturated carboxylic anhydride refers to a compound containing the structure of carboxylic acid or carboxylic anhydride and unsaturated polymerizable bonds without being limited to any specific structure. For example, the compound can be an unsaturated monocarboxylic acid compound, an unsaturated dicarboxylic acid compound, an unsaturated acid anhydride compound, an unsaturated polycyclic carboxylic acid compound, an unsaturated polycyclic dicarboxylic acid compound and an unsaturated polycyclic acid anhydride compound.

Specific examples of the aforementioned unsaturated monocarboxylic acid compound can be (meth)acrylic acid, butenoic acid, α-chloroacrylic acid, ethyl acrylic acid, cinnamic acid, 2-(meth)acryloyloxyethyl succinate monoester, 2-(meth)acryloyloxyethyl hexahydrophthalate, 2-(meth)acryloyloxyethyl phthalate and omega-carboxyl polycaprolactone polyol monoacrylate (a trade name of ARONIX M-5300, manufactured by Toagosei Co., Ltd.).

Specific examples of the aforementioned unsaturated dicarboxylic acid compound are maleic acid, fumaric acid, mesaconic acid, itaconic acid and traconic acid. In an example of the present invention, the unsaturated dicarboxylic acid anhydride compound is the anhydride compound of the aforementioned unsaturated dicarboxylic acid compound.

Specific examples of the aforementioned unsaturated polycyclic carboxylic acid compound can be 5-carboxyl bicyclo[2.2.1]hept-2-ene, 5-carboxyl-5-methylbicyclo [2.2.1]hept-2-ene, 5-carboxyl-5-ethylbicyclo[2.2.2.1]hept-2-ene, 5-carboxyl-6-methylbicyclo [2.2.1]hept-2-ene and 5-carboxyl-6-ethylbicyclo[2.2.1]hept-2-ene.

A specific example of the aforementioned unsaturated polycyclic dicarboxylic acid compound can be 5,6-dicarboxylic bicyclo[2.2.1]hept-2-ene. The aforementioned unsaturated polycyclic dicarboxylic acid anhydride compound is the anhydride compound of the aforementioned unsaturated polycyclic dicarboxylic acid compound.

Preferably, the examples of the aforementioned compound (a1) of unsaturated carboxylic acid or unsaturated carboxylic anhydride are acrylic acid, methacrylic acid, maleic anhydride, 2-methacryloyloxyethyl succinate monoester and 2-methacryloyloxyethyl hexahydrophthalic acid. The compound (a1) of unsaturated carboxylic acid or unsaturated carboxylic anhydride can be used alone or in a combination of two or more.

Based on the amount of the compound used to polymerize the alkali-soluble resin (A-2) as 100 parts by weight, an amount of the unsaturated compound containing epoxy group(s) (a2) is 10 parts by weight to 50 parts by weight, preferably is 12 parts by weight to 45 parts by weight, and more preferably is 15 parts by weight to 40 parts by weight. Specific examples of the unsaturated compound containing epoxy group(s) (a2) may be (meth)acrylate compounds containing epoxy group(s), α-alkyl acrylate compounds containing epoxy group(s) and glycidyl ether compounds.

Specific examples of the (meth)acrylate containing epoxy group(s) may be glycidyl (meth)acrylate, 2-methylglycidyl (meth)acrylate, 3,4-epoxybutyl (meth)acrylate, 6,7-epoxyheptyl (meth)acrylate, 3,4-epoxycyclohexyl (meth)acrylate and 3,4-epoxycyclohexylmethyl (meth)acrylate.

Specific examples of the α-alkyl acrylate compounds containing epoxy group(s) may be glycidyl α-ethylacrylate, glycidyl α-n-propylacrylate, glycidyl α-n-butylacrylate and 6,7-epoxyheptyl α-ethylacrylate.

Specific examples of the glycidyl ether compounds may be o-vinylbenzylglycidylether, m-vinylbenzylglycidylether and p-vinylbenzylglycidylether.

Preferably, the examples of the unsaturated compound containing epoxy group(s) (a2) may be glycidyl methacylate, 3,4-epoxycyclohexylmethyl (meth)acrylate, 6,7-epoxyheptyl methaacrylate, o-vinylbenzylglycidylether, m-vinylbenzylglycidylether and p-vinylbenzylglycidylether.

Based on the amount of the compounds used to polymerize the alkali-soluble resin (A-2) as 100 parts by weight, an amount of the other unsaturated compounds (a3) is 0 parts by weight to 85 parts by weight, preferably is 10 parts by weight to 80 parts by weight, and more preferably is 20 parts by weight to 75 parts by weight. Specific examples of the other unsaturated compounds (a3) may be alkyl (meth)acrylate, alicyclic (meth)acrylate, aryl (meth)acrylate, unsaturated dicarboxylic diester, hydroxyalkyl (meth)acrylate, polyether of (meth)acrylate, aromatic vinyl compounds and other unsaturated compounds.

Specific examples of the alkyl (meth)acrylate may be methyl (meth)acrylate, ethyl (meth)acrylate, n-propyl (meth)acrylate, iso-propyl (meth)acrylate, n-butyl (meth)acrylate, iso-butyl (meth)acrylate, sec-butyl (meth)acrylate and tert-butyl (meth)acrylate.

Specific examples of the alicyclic (meth)acrylate may be cyclohexyl (meth)acrylate, 2-methylcyclohexyl (meth)acrylate, tricyclic[5.2.1.02,6]deca-8-yl (meth)acrylic ester (or referred to as dicyclopentanyl (meth)acrylate), dicycopentyloxyethyl (meth)acrylate, isobornyl (meth)acrylate and tetrahydrofuranyl (meth)acrylate.

Specific examples of the aryl (meth)acrylate may be phenyl (meth)acrylate and benzyl (meth)acrylate.

Specific examples of the unsaturated dicarboxylic diester may be diethyl maleate, diethyl fumarate and diethyl itaconate.

Specific examples of the hydroxyalkyl (meth)acrylate may be 2-hydroxyethyl (meth)acrylate and 2-hydroxypropyl (meth)acrylate.

Specific examples of the polyether of (meth)acrylate may be polyethylene glycol mono(meth)acrylate and polypropylene glycol mono(meth)acrylate.

Specific examples of the aromatic vinyl compounds may be styrene monomer, α-methylstyrene, m-methylstyrene, p-methylstyrene and p-methoxy styrene.

Specific examples of the other unsaturated compounds may be acrylonitrile, methacrylonitrile, chloroethylene, vinylidene chloride, acrylamide, methacrylamide, vinyl acetate, 1,3-butadiene, isoprene, 2,3-dimethyl 1,3-butadiene, N-cyclohexyl maleimide, N-phenyl maleimide, N-benzyl maleimide, N-succinimide-3-maleimidobenzoic ester, N-succimide-4-maleimidobutyric ester, N-succinimide-6-maleimidocaproate, N-succinimide-3-maleimido propionic ester and N-(9-acridinyl) maleimide.

Preferably, the examples of the other unsaturated compounds (a3) are methyl (meth)acrylate, butyl (meth)acrylate, 2-hydroxyethyl (meth)acrylate, tert-butyl (meth)acrylate, benzyl (meth)acrylate, dicyclopentyl (meth)acrylate, dicyclopentyloxyethyl (meth)acrylate, styrene and p-methoxy styrene. The other unsaturated compounds (a3) can be used alone or in a combination of two or more.

Specific examples of a solvent used during manufacturing the alkali-soluble resin (A-2) of the present invention may be alcohol, ether, glycol ether, ethylene glycol monoalkyl ether acetate, diethylene glycol, dipropylene glycol, propylene glycol monoalkyl ether, propylene glycol monoalkyl ether acetate, propylene glycol monoalkyl ether propionate, aromatic hydrocarbon, ketone and ester.

Specific examples of the alcohol are methanol, ethanol, phenylcarbinol, 2-phenylethanol and 3-phenyl-1-propanol.

Specific example of the ether is tetrahydrofuran.

Specific examples of the glycol ether are ethylene glycol monopropyl ether, ethylene glycol monomethyl ether and ethylene glycol monoethyl ether.

Specific examples of the ethylene glycol monoalkyl ether acetate are ethylene glycol monobutyl ether acetate, ethylene glycol monoethyl ether acetate and ethylene glycol monomethyl ether acetate.

Specific examples of the diethylene glycol are diethylene glycol monomethyl ether, diethylene glycol monoethyl ether and diethylene glycol monobutyl ether, diethylene glycol dimethyl ether, diethylene glycol diethyl ether and diethylene glycol methyl ethyl ether.

Specific examples of the dipropylene glycol are dipropylene glycol monomethyl ether, dipropylene glycol monoethyl ether, dipropylene glycol dimethyl ether, dipropylene glycol diethyl ether and dipropylene glycol methyl ethyl ether.

Specific examples of the propylene glycol monoalkyl ether are propylene glycol monomethyl ether, propylene glycol monoethyl ether, propylene glycol monopropyl ether and propylene glycol monobutyl ether.

Specific examples of the propylene glycol monoalkyl ether acetate are propylene glycol methyl ether acetate, propylene glycol ethyl ether acetate, propylene glycol propyl ether acetate and propylene glycol butyl ether acetate.

Specific examples of the propylene glycol alkyl ether propionate are propylene glycol methyl ether propionate, propylene glycol ethyl ether propionate, propylene glycol propyl ether propionate and propylene glycol butyl ether propionate.

Specific examples of the aromatic hydrocarbon are methylbenzene and dimethylbenzene.

Specific examples of the ketone are ethyl methyl ketone, cyclohexanone and diacetone alcohol.

Specific examples of the ester are methyl acetate, ethyl acetate, propyl acetate, butyl acetate, ethyl 2-hydroxypropionate, methyl 2-hydroxy-2-methpropionate, ethyl 2-hydroxy-2-methpropionate, methyl glycolate, ethyl glycolate, butyl glycolate, methyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methbutyrate, methyl methoxyacetate, ethyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, 3-methoxybutyl acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxylpropionate, ethyl 3-propoxylpropionate, propyl 3-propoxylpropionate, butyl 3-propoxylpropionate, methyl 3-butoxypropionate, ethyl 3-butoxypropionate, propyl 3-butoxypropionate and butyl 3-butoxypropionate.

Preferably, the examples of the solvent used for manufacturing the alkali-soluble resin (A-2) of the present invention are diethylene glycol dimethyl ether and propylene glycol monomethyl ether acetate. The aforementioned solvent can be used alone or in a combination of two or more.

A polymerizing initiator can be used during the process of manufacturing the alkali-soluble resin (A-2) of the present invention. Specific examples of the polymerizing initiator are azo compounds or peroxides.

Specific examples of the azo compounds are 2,2'-azobis (isobutyronitrile), 2,2'-azobis(2,4-dimethylvaleronitrile), 2,2'-azobis(4-methoxy-2,4-dimethylvaleronitrile), 2,2'-azobis(2-methyl butyronitrile), 4,4'-azobis(4-cyano valeric acid), 2,2'-azobis(dimethyl-2-methylpropionate) and 2,2'-azobis(4-methoxy-2,4-dimethylvaleronitrile).

Specific examples of the peroxides are dibenzoyl peroxide, dilauroyl peroxide, tert-butyl peroxypivalate, 1,1-di (tert-butylperoxy)cyclohexane and hydrogen peroxide.

The polymerizing initiators can be used alone or in a combination of two or more.

A weight average molecular weight of the alkali-soluble resin (A-2) of the present invention is generally 3,000 to 100,000, preferably is 4,000 to 80,000, and more preferably is 5,000 to 60,000. The weight average molecular weight of the alkali-soluble resin (A-2) of the present invention can be adjusted by using a single resin or using two or more resins with different molecular weights synergistically.

Based on the amount of the alkali-soluble resin (A) as 100 parts by weight, the amount of the alkali-soluble resin (A-2) is 0 to 70 parts by weight, preferably is 0 to 50 parts by weight, and more preferably is 0 to 30 parts by weight.

Compound Having a Vinyl Unsaturated Group (B)

The compound having a vinyl unsaturated group (B) described herein can include a compound (B-1) having a structure of formula (b-II) or formula (b-II), and other compounds having a vinyl unsaturated groups (B-2).
Compound (B-1)
The compound (B-1) includes the structure of the formula (b-I) and/or the formula (b-II):

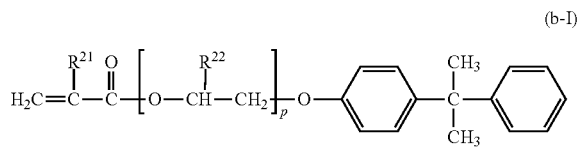

(b-I)

in the formula (b-I), $R^{21}$ and $R^{22}$ individually and independently represent a hydrogen atom and a methyl group, p represents a number of 0 to 4.

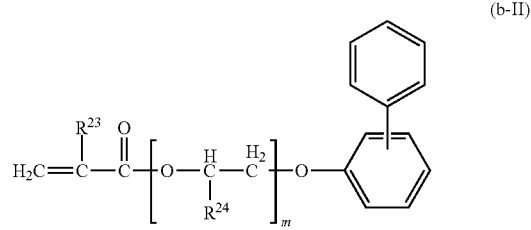

(b-II)

in the formula (b-II), $R^{23}$ and $R^{24}$ individually and independently represent a hydrogen atom and a methyl group, m represents a number of 0 to 4.

The p and the m in the formula (b-I) and the formula (b-II) represent an average number of addition of an alkoxyl group per molecule.

Specific examples of the aforementioned compound (B-1) having the structure of the formula (b-I) can be p-(isopropylphenyl)phenyl (meth)acrylate and p-(isopropylphenylphenoxy) ethyl (meth)acrylate, and is preferably p-isopropylphenylphenoxy ethyl (meth)acrylate.

Specific examples of the aforementioned compound (B-1) having the structure of the formula (b-II) can be o-phenylphenyl(meth)acrylate, m-phenylphenyl(meth)acrylate, p-phenylphenyl(meth)acrylate, o-phenylphenoxy ethyl (meth)acrylate, m-phenylphenoxy ethyl (meth)acrylate and p-phenylphenoxy ethyl (meth)acrylate, preferably are o-phenylphenyl(meth)acrylate and o-phenylphenoxy ethyl (meth)acrylate.

Based on the amount of the alkali-soluble resin (A) as 100 parts by weight, the amount of the compound (B-1) is 15 parts by weight to 100 parts by weight, preferably is 20 parts by weight to 90 parts by weight, and more preferably is 25 parts by weight to 80 parts by weight. If the photosensitive resin composition includes the compound (B-1), the refractivity and adhesivity to Mo of the film formed by the photosensitive resin composition can be further improved.

Though not willing to be limited by a theory, it is believed that due to having an aromatic structure, the compound (B-1) has a better refractivity. In addition, the compound (B-1) has a steric structure, thus a shrinkage rate and strain inside the film are lowered down, and the compound (B-1) has better adhesivity to Mo.

Other Compound Having a Vinyl Unsaturated Group (B-2)

The compound having the vinyl unsaturated group (B) of the present invention can include other compounds having the vinyl unsaturated group (B-2), which is selected from a compound having a vinyl unsaturated group or a compound having at least two (including two) vinyl unsaturated groups.

The compound having a vinyl unsaturated group can include but is not limited to (meth)acryloyl morpholine, 7-amino-3,7-dimethyloctylamine (meth)acrylate, isobutoxymethyl (meth)acrylamide, isobornyloxyethyl (meth)acrylate, isobornyl (meth)acrylate, 2-ethylhexyl (meth)acrylate, ethyl diethylene glycol (meth)acrylate, tert-octyl (meth)acrylamide, dipropyl ketone (meth)acrylate, (dimethylamino)ethyl (meth)acrylate, dodecyl (meth)acrylate, dicyclopentenyloxyethyl (meth)acrylate, dicyclopentenyl (meth)acrylate, N,N-dimethyl (meth)acrylamide, tetrachlorobenzene (meth)acrylate, 2-tetrachlorophenoxylethyl (meth)acrylate, tetrahydrofurfuryl (meth)acrylate, tetrabromobenzene (meth)acrylate, 2-tetrabromophenoxylethyl (meth)acrylate, 2-trichlorophenoxylethyl (meth)acrylate, tribromobenzene (meth)acrylate, 2-tribromophenoxylethyl (meth)acrylate, 2-hydroxyethyl (meth)acrylate, 2-hydroxypropyl (meth)acrylate, vinylcaprolactam, N-vinyl pyrrolidone, phenoxyethyl (meth)acrylate, pentachlorobenzene (meth)acrylate, pentabromobenzene (meth)acrylate, glycerol polymono(meth)acrylate, propanediol polymono(meth)acrylate, borneol (meth)acrylate. The compound having a vinyl unsaturated group can be used alone or in a combination of two or more.

The aforementioned compound having at least two vinyl unsaturated groups can include but is not limited to diethylene glycol di(meth)acrylate, dicyclopentene di(meth)acrylate, triethylene glycol di(meth)acrylate, tetraethylene glycol di(meth)acrylate, tri(2-hydroxyethyl)isocyanate di(meth)acrylate, tri(2-hydroxyethyl)isocyanate tri(meth)acrylate, caprolactone modified tri(2-hydroxyethyl)isocyanate tri(meth)acrylate, trihydroxymethylpropyl tri(meth)acrylate, ethylene oxide (hereinafter abbreviated as EO) modified trihydroxymethylpropyl tri(meth)acrylate, propylene oxide (hereinafter abbreviated as PO) modified trihydroxymethylpropyl tri(meth)acrylate, tri(propylene glycol) di(meth)acrylate, neopentyl glycol di(meth)acrylate, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra (meth)acrylate, EO modified dipentaerythritol hexa(meth)acrylate, EO modified dipentaerythritol penta(meth)acrylate, di(trimethylolpropane) tetra(meth)acrylate, EO modified bisphenol A di(meth)acrylate, PO modified bisphenol A di(meth)acrylate, EO modified hydrogenated bisphenol A di(meth)acrylate, PO modified hydrogenated bisphenol A di(meth)acrylate, PO modified glycerol triacrylate, EO modified bisphenol F di(meth)acrylate, phenolic polyglycidyl ether (meth)acrylate. The aforementioned compound having at least two vinyl unsaturated groups can be used alone or in a combination of two or more.

Based on the amount of the alkali-soluble resin (A) as 100 parts by weight, an amount of the compound having the vinyl unsaturated group (B) is 15 parts by weight to 300 parts by weight, preferably is 25 parts by weight to 280 parts by weight, and more preferably is 40 parts by weight to 250 parts by weight.

Photoinitiator (C)

The photoinitiator (C) of the present invention is subjected to no specific limitation, and an example of the photoinitiator (C) of the present invention can include but is not limited to O-acyloxime photoinitiators, triazine photoinitiators, acetophenone compounds, biimidazole compounds, benzophenone compounds, a-diketone compounds, ketol compounds, ketol ether compounds, acyl phosphine oxide compounds, quinone compounds, compounds containing halogens and peroxides. The following describes in detail.

Specific examples of the aforementioned O-acyloxime photoinitiators are 1-[4-(phenylthio)phenyl]-heptane-1,2-diketone 2-(O-benzoyloxime), 1-[4-(phenylthio)phenyl]-octane-1,2-diketone 2-(O-benzoyloxime), 1-[4-(benzoyl)phenyl]-heptane-1,2-diketone 2-(O-benzoyloxime), 1-[9-ethyl-6-(2-methylbenzoyl)-9H-carbazole-3-yl]-ethyl ketone 1-(O-acetaldoxime), 1-[9-ethyl-6-(3-methylbenzoyl)-9H-carbazole-3-yl]-ethyl ketone 1-(O-acetaldoxime), 1-[9-ethyl-6-benzoyl-9H-carbazole-3-yl]-ethyl ketone 1-(O-acetaldoxime), ethyl ketone-1-[9-ethyl-6-(2-methyl-4-tetrahydrofuranylbenzoyl)-9H-carbazole-3-yl]-1-(O-acetaldoxime), ethyl ketone-1-[9-ethyl-6-(2-methyl-4-tetrahydropyranylbenzoyl)-9H-carbazole-3-yl]-1-(O-acetaldoxime), ethyl ketone-1-[9-ethyl-6-(2-methyl-5-tetrahydrofuranylbenzoyl)-9H-carbazole-3-yl]-1-(O-acetaldoxime), ethyl ketone-1-[9-ethyl-6-(2-methyl-5-tetrahydropyranylbenzoyl)-9H-carbazole-3-yl]-1-(O-acetaldoxime), ethyl ketone-1-[9-ethyl-6-(2-methyl-4-methoxytetrahydrofuranylmethoxybenzoyl)-9H-carbazole-3-yl]-1-(O-acetaldoxime), ethyl ketone-1-[9-ethyl-6-(2-methyl-4-methoxytetrahydropyranylmethoxybenzoyl)-9H-carbazole-3-yl]-1-(O-acetaldoxime), ethyl ketone-1-[9-ethyl-6-(2-methyl-5-methoxytetrahydrofuranytmethoxybenzoyl)-9H-carbazole-3-yl]-1-(O-acetaldoxime), ethyl ketone-1-[9-ethyl-6-(2-methyl-5-methoxytetrahydropyranylmethoxybenzoyl)-9H-carbazole-3-yl]-1-(O-acetaldoxime), ethyl ketone-1-[9-ethyl-6-{2-methyl-4-(2,2-dimethyl-1,3-dioxolan)benzoyl}-9H-carbazole-3-yl]-1-(o-acetaldoxime) and ethyl ketone-1-[9-ethyl-6-{2-methyl-4-(2,2-dimethyl-1,3-dioxolan)methoxybenzoyl}-9H-carbazole-3-yl]-1-(O-acetaldoxime).

Preferably, the aforementioned O-acyloxime photoinitiators are 1-[4-(phenylthio)phenyl]-octane-1,2-diketone 2-(o-benzoyloxime) (e.g. trade name of OXE 01, manufactured by Ciba Specialty Chemicals Co.), 1-[9-ethyl-6-(2-benzoyl-methylbenzoyl)-9H-carbazole-3-yl]-ethyl ketone 1-(O-acetaldoxime) (e.g. trade name of OXE 02, manufactured by Ciba Specialty Chemicals Co.), ethyl ketone-1-[9-ethyl-6-(2-methyl-4-tetrahydrofuranmethoxybenzoyl)-9H-carbazole-3-yl]-1-(O-acetaldoxime) and ethyl ketone-1-[9-ethyl-6-{2-methyl-4-(2,2-dimethyl-1,3-dioxolan)methoxybenzoyl}-9H-carbazole-3-yl]-1-(O-acetaldoxime). The aforementioned O-acyloxime photoinitiators can be used alone or in a combination of two or more.

Specific examples of the triazine photoinitiator of the present invention are vinyl-halomethyl-s-triazine compounds, 2-(naphtho-1-yl)-4,6-bis-halomethyl-s-triazine compounds and 4-(p-aminophenyl)-2,6-bis-halomethyl-s-triazine compounds.

Specific examples of the vinyl-halomethyl-s-triazine compound are 2,4-bis(trichloromethyl)-6-p-methoxy styrene-s-triazine, 2,4-bis(trichloromethyl)-3-(1-p-dimethylaminophenyl-1,3-butadienyl)-s-triazine and 2-trichloromethyl-3-amino-6-p-methoxy styrene-s-triazine.

Specific examples of the 2-(naphtho-1-yl)-4,6-bis-halomethyl-s-triazine compound are 2-(naphtho-1-yl)-4,6-bis-trichloromethyl-s-triazine, 2-(4-methoxy-naphtho-1-yl)-4,6-bis-trichloromethyl-s triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-methoxy-naphtho-2-yl)-4,6-bis-trichloromethyl-s-triazine and 2-(4,5-dimethoxy-naphtho-1-yl)-4,6-bis-trichloromethyl-s-triazine.

Specific examples of the 4-(p-aminophenyl)-2,6-di-halomethyl-s-triazine are 4-[p-N,N-di(ethoxycarbonylmethyl)aminophenyl]-2,6-bis(trichloromethyl)-s-triazine, 4-[o-methyl-p-N,N-di(ethoxycarbonylmethyl)aminophenyl]-2,6-bis(trichloromethyl)-s-triazine, 4-[p-N,N-di(chloroethyl)aminophenyl]-2,6-bis(trichloromethyl)-s-triazine, 4-[o-methyl-p-N,N-di(chloroethyl)aminophenyl]-2,6-bis(trichloromethyl)-s-triazine, 4-(p-N-chloroethylaminophenyl)-2,6-bis(trichloromethyl)-s-triazine, 4-(p-N-ethoxycarbonylmethylaminophenyl)-2,6-bis(trichloromethyl)-s-triazine, 4-[p-N,N-di(phenyl)aminophenyl]-2,6-bis(trichloromethyl)-s-triazine, 4-(p-N-choroethylcarbonyaminophenyl)-2,6-bis(trichloromethyl)-s-triazine, 4-[p-N-(p-methoxyphenyl)carbonylaminophenyl-2,6-bis(trichloromethyl)-s-triazine, 4-m-N,N-di(ethoxycarbonylmethyl)aminophenyl]-2,6-bis(trichloromethyl)-s-triazine, 4-[m-bromo-p-N,N-di(ethoxycarbonylmethyl)aminophenyl]-2,6-bis(trichloromethyl)-s-triazine, 4-[m-chloro-p-N,N-di(ethoxycarbonylmethyl)aminophenyl]-2,6-bis(trichloromethyl)-s-triazine, 4-[m-fluoro-p-N,N-di(ethoxycarbonylmethyl)aminophenyl]-2,6-bis(trichloromethyl)-s-triazine, 4-[o-bromo-p-N, N-di(ethoxycarbonylmethyl)aminophenyl]-2,6-bis(trichloromethyl)-s-triazine, 4-[o-chloro-p-N, N-di(ethoxycarbonylmethyl)aminophenyl]-2,6-bis(trichloromethyl)-s-triazine, 4-[o-fluoro-p-N,N-di(ethoxycarbonylmethyl)aminophenyl]-2,6-bis(trichloromethyl)-s-triazine, 4-[o-bromo-p-N,N-di(chloroethyl)aminophenyl]-2,6-bis(trichloromethyl)s-triazine, 4-[o-chloro-p-N,N-di(chloroethyl)aminophenyl]-2,6-bis(trichloromethyl)-s-triazine, 4-[o-fluoro-p-N,N-di(chloroethyl)aminophenyl]-2,6-bis(trichloromethyl)-s-triazine, 4-[m-bromo-p-N,N-di(chloroethyl)aminophenyl]-2, 6-bis(trichloromethyl)-s-triazine, 4-[m-chloro-N,N-di(chloroethyl)aminophenyl]-2,6-bis(trichloromethyl)-s-triazine 4-[m-fluoro-p-N,N-di(chloroethyl)aminophenyl]-2,6-bis(trichloromethyl)-s-triazine, 4-(m-bromo-p-N-ethoxycarbonylmethylaminophenyl)-2,6-bis(trichloromethyl)-s-triazine, 4-(m-chloro-p-N-ethoxycarbonylmethylaminophenyl)-2,6-bis(trichloromethyl)-s-triazine, 4-(m-fluoro-p-N-ethoxycarbonylmethylaminophenyl)-2,6-bis(trichloromethyl)-s-triazine, 4-(m-bromo-p-N-ethoxycarbonylmethylaminophenyl)-2,6-bis(trichloromethyl)-s-triazine, 4-(m-chloro-p-N-ethoxycarbonylmethylaminophenyl)-2,6-bis(trichloromethyl)-s-triazine, 4-(m-fluoro-p-N-ethoxycarbonylmethylaminophenyl)-2,6-bis(trichloromethyl)-s-triazine 4-(o-bromo-p-N-ethoxycarbonylmethylaminophenyl)-2,6-bis(trichloromethyl)-s-triazine, 4-(o-chloro-p-N-carbonylethoxycarbonylmethylaminophenyl)-2,6-bis(trichloromethyl)-s-triazine, 4-(o-fluoro-p-N-carbonylethoxycarbonylmethylaminophenyl)-2,6-bis(trichloromethyl)-s-triazine, 4-(m-bromo-p-N-chloroethylaminophenyl)-2,6-bis(trichloromethyl)-s-triazine, 4-(m-chloro-p-N-chloroethylaminophenyl)-2,6-bis(trichloromethyl)-s-triazine, 4-(m-fluoro-p-N-chloroethylaminophenyl)-2,6-bis(trichloromethyl)-s-triazine, 4-(o-bromo-p-N-chloroethylaminophenyl)-2,6-bis(trichloromethyl)-s-triazine, 4-(o-chloro-p-N-chloroethylaminophenyl)-2,6-bis(trichloromethyl)-s-triazine, 4-(o-fluoro-p-N-chloroethylaminophenyl)-2,6-bis(trichloromethyl)-s-triazine and 2,4-bis(trichloromethyl)-6-[3-bromo-4-[N,N-di(ethoxycarbonylmethyl)amido]phenyl]-1,3,5-triazine.

Preferably, the 4-(p-aminophenyl)-2,6-di-halomethyl-s-triazine compounds are 4-[m-bromo-p-N,N-di(ethoxycarbonylmethyl)aminophenyl]-2,6-di(chlorotrichloromethyl)-s-triazine and 2,4-bis(chlorotrichloromethyl)-6-p-methoxystyrene-s-triazine. Depending on requirements of the manufacturing process, the 4-(p-aminophenyl)-2,6-di-halomethyl-s-triazine compounds can be used alone or in a combination of two or more.

Specific examples of the acetophenone compounds are p-dimethylamine acetophenone, α,α'-dimethoxy azoxy acetophenone, 2,2'-dimethyl-2-phenyl acetophenone, p-methoxy acetophenone, 2-methyl-1-[4-(methylthio)phenyl]-2-morpholino-1-propanone and 2-benzyl-2-N,N-dimethylamine-1-(4-morpholinophenyl)-1-butanone. Preferably, the acetophenone compounds are 2-methyl-1-[4-(methylthio)phenyl]-2-morpholino-1-propanone and 2-benzyl-2-N,N-dimethylamine-1-(4-morpholinophenyl)-1-butanone.

Depending on requirements of the manufacturing process, the acetophenone compounds can be used alone or in a combination of two or more.

Specific examples of the biimidazole compounds are 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis(o-ethylphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole and 2,2'-bis(2-chlorophenyl)-4,4',5,5'-tetraphenylbiimidazole, 2,2'-bis(2,4-dichlorophenyl)-4,4',5,5'-tetraphenylbiimidazole. Preferably, the biimidazole compound is 2,2'-bis(2,4-dichlorophenyl)-4,4',5,5'-tetraphenylbiimidazole. Depending on requirements of the manufacturing process, the biimidazole compounds can be used alone or in a combination of two or more.

Specific examples of the benzophenone compounds are thioxanthone, 2,4-diethylthioxanthone, thioxanthone-4-sulphone, benzophenone, 4,4'-bis(dimethylamine) benzophenone and 4,4'-bis(diethylamino) benzophenone. Preferably, the benzophenone compound is 4,4'-bis(diethylamino) benzophenone. Depending on requirements of the manufacturing process, the benzophenone compounds can be used alone or in a combination of two or more.

Specific examples of the α-diketone compounds are benzil, diacetyl; a specific example of the ketol compound is benzoin; specific examples of the ketol ether compounds are benzoin methyl ether, benzoin ethyl ether and benzoin isopropyl ether; specific examples of the acyl phosphine oxide compounds are 2,4,6-trimethylbenzoyl diphenylphosphine oxide and bis-(2,6-dimethoxybenzoyl)-2,4,4-trimethylphenyl phosphine oxide; specific examples of the quinone compounds are anthraquinone and 1,4-naphthoquinone; specific examples of the compounds containing halogens are phenacyl chloride, tribromomethyl phenyl sulfone and tri(trichloromethyl)-s-triazine; and a specific example of the peroxide is bis-tert-butyl peroxide. Depending on requirements of the manufacturing process, the aforementioned α-diketone compounds, ketol compound, ketol ether compounds, acyl phosphine oxide compounds, quinone compounds, the compounds containing halogens and peroxides can be used alone or in a combination of two or more.

An amount of the photoinitiator (C) can be adjusted depending on the desired requirement. In a specific example of the present invention, based on the amount of the alkali-soluble resin (A) as 100 parts by weight, an amount of the photoinitiator (C) is 10 parts by weight to 100 parts by weight, preferably is 12 parts by weight to 90 parts by weight, and more preferably is 15 parts by weight to 80 parts by weight.

Solvent (D)

The solvent (D) of the present invention can be dissolved completely with other organic compositions, and has high volatility so that the solvent (D) can be evaporated from the dispersion liquid with little heat under normal pressure. Therefore, a solvent with a boiling point below 150° C. under normal pressure is mostly used. The solvent (D) includes aromatics, such as benzene, methylbenzene and dimethylbenzene; alcohols, such as methanol and ethanol; ethers, such as ethylene glycol monopropyl ether, diethylene glycol dimethyl ether, tetrahydrofuran, ethylene glycol monomethyl ether, ethylene glycol monoethyl ether, diethylene glycol methyl ether, diethylene glycol ethyl ether, diethylene glycol butyl ether; esters, such as ethylene glycol monomethyl ether acetate, ethylene glycol ether acetate, propylene glycol monomethyl ether acetate, propylene glycol ethyl ether acetate, propylene glycol propyl ether acetate, ethyl 3-ethoxypropionate; and ketones such as ethylmethyl ketone and acetone. Preferably, the solvent (D) is diethylene glycol dimethyl ether, propylene glycol monomethyl ether acetate, ethyl 3-ethoxypropionate or in a combination of two or more so that the photosensitive resin composition has excellent storage stability.

An amount of the solvent (D) can be adjusted depending on requirements. Based on the amount of the alkali-soluble resin (A) as 100 parts by weight, the amount of the solvent (D) is 500 parts by weight to 3000 parts by weight, preferably is 600 parts by weight to 2800 parts by weight, and more preferably is 700 parts by weight to 2500 parts by weight.

Silane Compound (E)

The photosensitive resin composition of the present invention includes a silane compound (E). The silane compound (E) includes a silane compound (E-1) having a structure of formula (I):

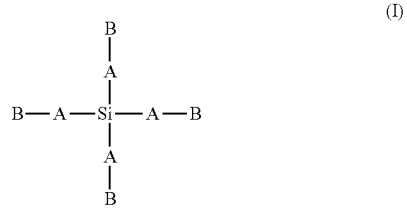

in the formula (I), A individually and independently represents a single bond, an alkylene group or an arylene group, B individually and independently represents a hydrogen atom, an alkyl group, an aryl group, —OR or an organic group having a diphenyl phosphine group, in which R is an alkyl group of 1 to 6 carbons or a phenyl group, in which at least one B is the organic group having the diphenyl phosphine group, at least one B is —OR, and when B is —OR, A connected to B is the single bond.

Specific Examples of the silane compound (E-1) can include [4-dimethyl(1-methylethoxy)silyl]phenyl]diphenyl phosphine, [2-[dimethyl(1-methylethoxy)silyl]phenyl]diphenylphosphine, [2-(methoxydiphenylsilyl)phenyl]diphenyl phosphine, [(ethoxysilylidyne)tris(methylene)]tris[diphenyl phosphine], [(ethoxydimethylsilyl)methylene]bis [diphenyl phosphine], [2-(ethoxydimethylsilyl)ethyl] diphenylphosphine, [3-(dimethylphenoxysilyl)propyl] diphenyl phosphine, [(dimethylphenoxysilyl)methyl] diphenylphosphine, [4-(ethoxydimethylsilyl)phenyl] diphenylphosphine, [2-(dimethylphenoxysilyl)ethyl] diphenylphosphine, [3-(ethoxydimethylsilyl)propyl] diphenylphosphine, [(ethoxydimethylsilyl)methyl] diphenylphosphine, [(dimethoxysilylene)bis(methylene)]bis [diphenyl phosphine], [(diethoxysilylene)di-2,1-ethanediyl] bis[diphenyl phosphine], [4-(diethoxymethylsilyl)phenyl] diphenylphosphine, [(diethoxysilylene)di-3, 1-propanediyl] bis[diphenyl phosphine], [3-(diethoxymethylsilyl)propyl] diphenylphosphine, [(diethoxymethylsilyl)methyl] diphenylphosphine, [2-(diethoxymethylsilyl)ethyl] diphenylphosphine, bis(2-diphenylphosphinoethyl)-methylsilyethyltriethoxysilane, [2-(trimethoxysilyl)ethyl] diphenylphosphine, [2-[6-(trimethoxysilyl)hexyl]-1,3-propanediyl] bis[diphenylphosphine], [6-(trimethoxysilyl) hexyl] diphenylphosphine, [2-[(triethoxysilyl)methyl]-1,3-propanediyl]bis [diphenylphosphine], [1-[2-(triethoxysilyl) ethyl]-1,2-ethanediy]bis [diphenylphosphine], [2-(trimethoxysilyl)ethyl]diphenylphosphine, [6-(triethoxysilyl)hexyl] diphenylphosphine, [4-(triethoxysilyl) butyl] diphenylphosphine, [(triethoxysilyl)methyl] diphenylphosphine, [1-[(triethoxysilyl)methyl]butyl]diphenylphosphine, [1-[(triethoxysilyl)methyl]propyl]diphenyl phosphine, [1-methyl-2-(triethoxysilyl)ethyl]diphenyl phosphine, [7-(triethoxysilyl)heptyl] diphenylphosphine, 1,1'-[(triethoxysilyl)methylene]bis[1,1-diphenyl phosphine], [2-(triethoxysilyl)ethyl] diphenyl phosphine, [4-(triethoxysilyl) phenyl]diphenylphosphine, [2-(triethoxysilyl)propyl] diphenylphosphine, [2-(triethoxysilyl)ethyl]diphenylphosphine or a combination of two or more.

Based on the amount of the alkali-soluble resin (A) as 100 parts by weight, an amount of the silane compound (E-1) is 1 part by weight to 10 parts by weight, preferably is 1.2 parts by weight to 9 parts by weight, and more preferably is 1.5 parts by weight to 8 parts by weight. If the photosensitive resin composition does not include the silane compound (E-1), the film formed by the photosensitive resin composition has poor refractivity and adhesivity to Mo.

Other Silane Compound (E-2)

The photosensitive resin composition of the present invention may further include other silane compound(s) (E-2), and the other silane compound(s) (E-2) may be an adhesion accelerator.

The aforementioned adhesion accelerator can improve adhesivity of the substrate, and preferably the adhesion accelerator is a functional silane crosslinking agent. Preferably, the functional silane crosslinking agent includes a carboxyl group, an alkenyl group, an isocyanate group, an epoxy group, an amine group, a hydrosulphonyl group or halogens. Specific examples of the adhesion accelerator are p-hydroxy phenyl trimethoxy silane, 3-methacryloxypropyl trimethoxysilane, vinyl triacetoxysilane, vinyl trimethoxysilane, vinyl triethoxysilane, vinyl tri(2-methoxyethoxy)silane, γ-isocyanatepropyl triethoxysilane, 3-glycidylpropyl trimethoxysilane, 2-(3,4-epoxycyclohexyl)ethyl trimethoxysilane, 3-glycidylpropryl dimethyl methoxysilane, 3-aminopropyl trimethoxysilane, N-(2-aminoethyl)-3-aminopropyl trimethoxysilane, N-(2-aminoethyl)-3-aminopropylmethyl dimethoxysilane, 3-mercaptopropyl trimethoxysilane, 3-chloropropyl trimethoxysilane and 3-chloropropylmethyl dimethoxysilane. In addition, the adhesion accelerator includes but is not limited to an adhesion auxiliary with a trade name of SZ 6030 (manufactured by Dow Corning Toray Silicone Co., KBE-903, KBE-603, KBE-403 and KBM-403 (manufactured by Shin-Etsu Chemical Co., Ltd.). Depending on requirements of the manufacturing process, the aforementioned adhesion auxiliary can be used alone or in a combination of two or more.

Based on the amount of the alkali-soluble resin (A) as 100 parts by weight, an amount of the other silane compound (E-2) is 0 to 11 parts by weight. Based on the amount of the alkali-soluble resin (A) as 100 parts by weight, an amount of the silane compound (E) is 1 part by weight to 12 parts by weight, preferably is 1.2 parts by weight to 11 parts by weight, and more preferably is 1.5 parts by weight to 10 parts by weight.

Inorganic Particles (F)

The photosensitive resin composition includes inorganic particles (F). The Group IV element oxide is a main component of the inorganic particles (F) according to the invention. By adding the inorganic particles (F) with high refractive rate, the refractivity of the film produced by the photosensitive resin composition is raised.

In one embodiment of the invention, a particle size of the inorganic particles (F) is from 1 nm to 100 nm; preferably is from 1 nm to 50 nm; more preferably is from 5 nm to 15 nm. A method for measuring the particle size may be a known one such as a method by dynamic light scattering. If the particle size is less than 1 nm, secondary aggregation and whiting easily occur in the film obtained thereby; if the particle size is greater than 100 nm, uniformity of a surface of the film may be impacted.

In one embodiment of the invention, the oxide suitable for the inorganic particles (F) is preferably titanium oxide, zirconium oxide, hafnium oxide and composite particles formed by the said metal oxide and silicon oxide as well as tin oxide. More preferably, the inorganic particles (F) is titanium oxide or zirconium oxide, i.e. the group IV element is more preferably titanium or zirconium.

In another aspect, the two crystalline forms, anatase and rutile coexist in titanium oxide. Preferably, the crystalline form is rutile type, which has high refractivity and excellent light resistance.

Furthermore, since titanium oxide has a photocatalytic activity, it is difficult to be applied in an optical field. Preferably, the surface of the particle of titanium oxide is covered by silicon oxide.

According to the present invention, the inorganic particles (F) may be a powder form or a dispersed sol form where the oxide particles are dispersed in a dispersion medium. Examples of the dispersion medium are methanol, methyl ethyl ketone, methyl isobutyl ketone, cyclohexanone, N-methyl-2-pyrrolidone, propylene glycol monomethyl ether, ethoxyethanol.

In one embodiment of the invention, commercially available titanium oxide particles are NanoTek TiO2 made by Japan CI Kasei (the dispersion medium is methyl isobutyl ketone, anatase type); Korea NanoCMS system, Lot No.: S111109 (the dispersion medium is ethoxyethanol, rutile type); Red Lake series made by JGC Shokubai Kasei, Japan (the dispersion medium is methanol, anatase type); TS series made by Tayca (the dispersion medium is methyl ethyl ketone, rutile type). Commercially available zirconium oxide particles are HXU-120JC made by Japan Osaka Cement Co. (the dispersion medium is methyl ethyl ketone) or zirconium oxide particles with the average particle size of 13.00 nm made by Mikuni Color Ltd.

In one embodiment of the invention, based on the amount of the alkali-soluble resin (A) as 100 parts by weight, an amount of the inorganic particles (F) is from 50 to 250 parts by weight, preferably from 60 to 230 parts by weight, more preferably from 70 to 200 parts by weight. If the inorganic particles (F) are used, the refractivity of the photosensitive resin composition can be improved, so as to raise the refractivity of the film obtained thereby.

Additives (G)

Additionally, the photosensitive resin composition of the present invention can further include additives (G) depending on required physical and chemical characteristics, and a selection of the additives (G) can be made by a skilled person in the art. In an example of the present invention, the additive (G) may be a loading agent, polymers except the alkali-soluble resin (A), an ultraviolet light absorber, an anti-agglutinant, a surfactant, a storage stabilizer or a heat-resistance promoter.

Specific examples of the aforementioned loading agent are glass and aluminum. Specific examples of the aforementioned polymers except the alkali-soluble resin (A) are polyvinyl alcohol, polyethylene glycol monoalkyl ether, polyfluoro alkyl acrylate.

Specific examples of the aforementioned ultraviolet light absorber are 2-(3-t-butyl-5-methyl-2-hydroxy phenyl)-5-chlorophenyl azide and alkoxy benzophenone; and the anti-agglutinant is polyacrylate sodium.

The aforementioned surfactant can facilitate a coating ability of the photosensitive resin composition of the present invention. Specific examples of the surfactant may be a fluorine-containing surfactant or a silicone surfactant.

The aforementioned fluorine-containing surfactant at least includes fluorinated alkyl group or a fluorinated alkylene group at an end, a main chain and a branch chain thereof, and specific examples of the fluorine-containing surfactant are 1,1,2,2-tetrafluoro octyl (1,1,2,2-tetrafluoro propyl) ether, 1,1,2,2-tetrafluoro octylhexyl ether, octaethylene glycol di(1,1,2,2-tetrafluorobutyl)ether, hexaethylene glycol (1,1,2,2,3,3-hexafluoropentyl)ether, octapropanediol di(1,1,2,2-tetrafluorobutyl)ether, hexapropanediol (1,1,2,2,3,3-hexafluoropentyl)ether, perfluoro sodium dodecyl sulfate, 1,1,2,2,8,8,9,9,10,10-perfluorododecane, 1,1,2,2,3,3-hexafluorodecane, fluothane benzene sulfonate, fluothane sodium phosphate, fluothane carboxylic sodium, fluothane polyoxyethylene ether, diglycerol tetra(fluothane polyoxyethylene ether), fluothane ammonium iodide, fluothane lycine, fluoroalkyl polyoxyethylene ether, perfluoroalkyl polyoxyethylene ether and perfluoroalkyl alkanol. In another example of the present invention, the fluorine-containing surfactant is BM-1000, BM-1100 (manufactured by BM CHEMIE), Megafac F142D, F172, F173, F183, F178, F191, F471, F476 (manufactured by Dainippon Ink And Chemicals, Inc.), Fluorad FC 170C, FC-171, FC-430, FC-431 (manufactured by Sumitomo Chemical Co., Ltd), chlorofluorocarbons S-112, S-113, S-131, S-141, S-145, S-382, SC-101, SC-102, SC-103, SC-104, SC-105, SC-106 (manufactured by AGC Display Glass Co., Ltd.), F Top EF301, 303, 352 (manufactured by Shin-Akita Kasei), Ftergent FT-100, FT-110, FT-140A, FT-150, FT-250, FT-251, FTX-251, FTX-218, FT-300, FT-310, FT-400S (manufactured by NEOSU).

Specific examples of the aforementioned organic silicone surfactant are TORE organic silicone, with the trade name of DC 3 Paint Additive (DC 3 PA), DC 7 PA, SH 11 PA, SH 21 PA, SH 28 PA, SH 29 PA, SH 30 PA, SH 190, SH 193, SZ 6032, SF-8427, SF-8428, DC 57, DC 190 (manufactured by Dow Corning Toray Silicone), TSF-4440, TSF-4300, TSF-4445, TSF-4446, TSF-4460, TSF-4452 (manufactured by Momentive Performance Materials Inc).

The aforementioned surfactant may also be other surfactants in addition to the aforementioned fluorine-containing surfactant and a silicone surfactant, and the other surfactants may be polyoxyethylene alkyl ether, such as lauryl alcohol polyoxyethylene ether, polyoxyethylene stearate ether and polyoxyethylene oleyl ether; polyoxyethylene aryl ether, such as polyoxyethylene n-octyl phenyl ether and polyoxyethylene n-nonyl phenol ether, polyoxyethylene dialkyl ester, such as polyoxyethylene dilaurate and polyoxyethylene distearate; and nonionic surfactant, such as KP341 (manufactured by Shin-Etsu Chemical Co., Ltd.) and poly flow No. 57, 95 (manufactured by Kyoeisha grease Chemical Industries, Ltd).

The aforementioned surfactant can be used alone or in a combination of two or more.

The aforementioned storage stabilizer may be sulfur, quinones, hydroquinones, polyoxides, amines, nitroso compounds or nitryl group, and specific examples of the storage stabilizer are 4-methoxy phenol, (N-nitroso-N-phenyl) hydroxylamine aluminum, 2,2'-thio-bis(4-methyl-6-t-butylphenol) and 2,6-di-t-butylphenol.

The aforementioned heat-resistance promoter may be N-(alkoxymethyl) glycoluril compound and N-(alkoxymethyl) melamine. Specific examples of the aforementioned N-(alkoxymethyl) glycoluril compound are N,N,N',N'-tetra(methoxymethyl)glycoluril, N,N,N',N'-tetra(ethoxymethyl)glycoluril, N,N,N',N'-tetra(n-propoxymethyl)glycoluril, N,N,N',N'-tetra(isopropoxymethyl)glycoluril, N,N,N',N'-tetra(n-butoxymethyl)glycoluril and N,N,N',N'-tetra(t-butoxymethyl)glycoluril, and preferably is N,N,N',N'-tetra(methoxymethyl)glycoluril. Specific examples of the aforementioned N-(alkoxymethyl)melamine are as below: N,N,N',N',N'',N''-hexa(methoxymethyl)melamine, N,N,N',N',N'',N''-hexa(ethoxymethyl)melamine, N,N,N',N',N'',N''-hexa(n-propoxymethyl)melamine, N,N,N',N',N'',N'''-hexa (isopropoxymethyl)melamine, N,N,N',N',N",N"-hexa(n-butoxymethyl)melamine and N,N,N',N',N",N"-hexa(t-butoxymethyl)melamine, and preferably is N,N,N',N',N", N"-hexa(methoxymethyl)melamine. For example, commercial products of the aforementioned N-(alkoxymethyl)melamine are NIKARAKKU N-2702, MW-30M (manufactured by Sanwa Chemical).

An amount of the additives (G) of the present invention can be determined by a skilled person in the art. Preferably, based on the amount of the alkali-soluble resin (A) as 100 parts by weight, the amount of the additives (G) is 0 to 10 parts by weight, preferably is 0 to 6 parts by weight, and more preferably is 0 to 3 parts by weight.

Preparation of Film and Device Having the Same

The present invention provides a film on a substrate. The film is formed by coating the photosensitive resin composition on the substrate, and subjecting the substrate to a pre-bake treatment, an exposing treatment, a developing treatment and a post-bake treatment.

Preferably, the film is a planarized film, an interlayer insulating film of a TFT substrate in a liquid crystal display device or an organic light-emitting device, a core material of a waveguide element or a protective film of a wrapping material.

A coating method of the film of the present invention is subjected to no specific limitation. For example, the photosensitive resin composition is applied onto the substrate by spray-coating, roller-coating, spin-coating, slit-coating, bar-coating, ink-jet printing or the like, preferably by spin-coating or slit-coating. Then, the substrate is subjected to the pre-baking treatment to remove the solvent therein so as to form a prebaked film. The conditions of the pre-baking treatment depend on types and a formulating ratio of the components in the photosensitive resin composition. However, the prebaking treatment is usually conducted at a temperature ranging from 60° C. to 110° C. for 30 seconds to 15 minutes. Preferably, the prebaked film has a thickness ranging from 3 to 6 µm.

After the pre-baking treatment, the prebaked film is subjected to the exposing treatment via a photomask by using, for example, UV light, far-UV light, X ray, charged particle beam. For example, the UV light may be g-line (wavelength of 436 nm), h-line, or i-line (wavelength of 365 nm), the far-UV light may be KrF excimer laser, the X ray may be synchrotron radiation, and the charged particle beam may be an electron beam. Preferably, the UV light is adopted, and more preferably, the g-line or the i-line is adopted. Examples of a device for providing the UV light may include, but are not limited to, a high-pressure mercury lamp, an ultra-high pressure mercury lamp, and a metal halide lamp. Preferably, the exposure dose ranges from 50 to 1500 $J/m^2$.

The developing treatment is conducted by immersing the prebaked film into a developing solution for 30 seconds to 2 minutes, so as to remove an undesired portion and obtain a developed film with a desired pattern. Examples of the developing solution include: (1) inorganic alkali compounds, such as sodium hydroxide, potassium hydroxide, sodium carbonate, sodium silicate, sodium metasilicate, and ammonia; (2) primary aliphatic amines, such as ethylamine, and n-propylamine; (3) secondary aliphatic amines, such as diethylamine, and n-propylamine; (4) tertiary aliphatic amines, such as trimethylamine, N,N-diethylmethylamine, N,N-dimethylethylamine, and triethylamine; (5) tertiary alicyclic acids, such as pyrrole, piperidine, N-methyl piperidine, N-methyl-1,8-diazabicyclo[5.4.0]undec-7-ene, and 1,5-diazabicyclo[4.3.0]non-5-ene; (6) tertiary aromatic amines, such as pyridine, methylpyrimidine, dimethylpyridine, and quinoline; and (7) quaternary ammonium alkali compounds, such as an aqueous tetramethylammonium hydroxide solution and an aqueous tetraethylammonium hydroxide solution.

Moreover, water-soluble organic solvents and/or surfactants, such as methanol and ethanol, may be optionally added into the developing solution, and examples of the method of the developing treatment may be but not limited to puddle developing, impregnation developing (with or without sonication), and rinse developing.

The developing solution composed of the alkali components is usually removed by rinsing the developed film on the substrate with water, followed by drying with compressed air or nitrogen gas. Preferably, a post-exposure treatment is conducted using a high-pressure mercury lamp, so as to fully expose the developed film to the radiation. More preferably, the exposure dose of the post-exposure treatment ranges from 2000 to 5000 $J/m^2$.

Thereafter, the post-baking treatment is conducted via a heating device, such as a heating plate or an oven, with a temperature ranging from 120° C. to 250° C., so as to cure the film. The baking period of the post-baking treatment may vary depending on a type of the heating device. As for the heating plate, the heating time of the post-baking treatment ranges from 5 minutes to 30 minutes. As for the oven, the heating time ranges from 30 minutes to 90 minutes. The film is obtained by the aforementioned treatments.

Examples of the substrate suitable for the present invention include an alkali-free glass, a soda-lime glass, a Pyrex glass, a quartz glass, a glass coated with a transparent conductive film thereon, and the like, which are commonly used in a liquid crystal display; and a photoelectric conversion substrate (for example, a silicon substrate) used in a solid-state image sensor.

The present invention further provides a device including the aforementioned film.

According to the element of the present invention, the device includes but is not limited to a display device, a semiconductor device, an optical waveguide device or the like.

The following examples are provided to illustrate the preferred embodiments of the invention, and should not be construed as limiting the scope of the invention.

DETAILED DESCRIPTION

Preparation of Alkali-Soluble Resin (A)

Synthesis Example 1

A 500 mL four-necked flask was continuously added with 100 parts by weight of a fluorene epoxy compound (Model ESF-300, manufactured by Nippon Steel Chemical Co., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 6 parts by weight of tetrahydrophthalic anhydride and 13 parts by weight of benzophenonetetracarboxylic dianhydride (BTDA) were added. Then, the mixture solution was heated to 110° C. to 115° C. and reacted for 2 hours to obtain the resin (A-1-1) having an unsaturated group, wherein the resin (A-1-1) having an unsaturated group had an acid value of 98.0 mgKOH/g.

Synthesis Example 2

A 500 mL four-necked flask was continuously added with 100 parts by weight of a fluorene epoxy compound (Model ESF-300, manufactured by Nippon Steel Chemical Co., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 13 parts by weight of benzophenone tetracarboxylic dianhydride was added, and then the mixture solution was reacted for 2 hours at 90° C. to 95° C. Then, 6 parts by weight of tetrahydrophthalic anhydride was added, and the mixture solution was reacted for 4 hours at 90° C. to 95° C. to obtain the resin (A-1-2) having an unsaturated group, wherein the resin (A-1-2) having an unsaturated group had an acid value of 99.0 mgKOH/g.

Synthesis Example 3

A reaction vessel was added with 400 parts by weight of an epoxy compound (Model NC-3000, manufactured by Nippon Kayaku Co. Ltd.; epoxy equivalent 288), 102 parts by weight of acrylic acid, 0.3 parts by weight of methoxyphenol, 5 parts by weight of triphenyl phosphine, and 264 parts by weight of propylene glycol methyl ether acetate, wherein the temperature was maintained at 95° C., and the mixture was reacted for 9 hours to obtain an intermediate product having an acid value of 2.2 mgKOH/g. Then, 151 parts by weight of tetrahydrophthalic anhydride was added and the mixture was reacted for 4 hours at 95° C. to obtain the resin (A-1-3) having an acid value of 102 mgKOH/g and a weight average molecular weight of 3,200.

Synthesis Example 4

A 1000 ml four-necked flask equipped with a nitrogen inlet, a stirrer, a heater, a condenser and a thermometer was added with nitrogen introduced. 30 parts by weight of methacrylic acid, 35 parts by weight of glycidyl methacrylate, 10 parts by weight of 1,3-butadiene, 25 parts by weight of styrene, 2.4 parts by weight of 2,2'-azobis-2-methylbutyronitrile and 240 parts by weight of diethylene glycol dimethyl ether as the solvent were added. The mixture in the flask was then stirred at a temperature of 85° C. for 5 hours to be polycondensed. Next, the solvent was devolatilized to obtain the alkali-soluble resin (A-2-1).

Synthesis Example 5

A 1000 ml four-necked flask equipped with a nitrogen inlet, a stirrer, a heater, a condenser and a thermometer was added with nitrogen introduced. 10 parts by weight of 2-methacryloyloxyethyl succinate, 50 parts by weight of 3,4-epoxycyclohexylmethyl methacrylate, 20 parts by weight of 2-hydroxyethyl methacrylate, 10 parts by weight of dicyclopentanyl methacrylate, 10 parts by weight of styrene, 2.4 parts by weight of 2,2'-azobis-2-methylbutyronitrile and 240 parts by weight of diethylene glycol dimethyl ether as the solvent were added. The mixture in the flask was then stirred at a temperature of 85° C. for 5 hours to be polycondensed. Next, the solvent was devolatilized to obtain the alkali-soluble resin (A-2-2).

Synthesis Example 6

A 1000 ml four-necked flask equipped with a nitrogen inlet, a stirrer, a heater, a condenser and a thermometer was added with nitrogen introduced. 15 parts by weight of acrylic acid, 30 parts by weight of glycidyl methacrylate, 20 parts by weight of 2-hydroxy ethyl methacrylate, 35 parts by weight of benzyl methacrylate, 2.4 parts by weight of 2,2'-azobis-2-methylbutyronitrile and 240 parts by weight of diethylene glycol dimethyl ether as the solvent were added. The mixture in the flask was then stirred at a temperature of 85° C. for 5 hours to be polycondensed. Next, the solvent was devolatilized to obtain the alkali-soluble resin (A-2-3).

Preparation of Photosensitive Resin Composition

Example 1

100 parts by weight of alkali-soluble resin (A-1-1), 15 parts by weight of p-(isopropylphenyl)phenyl (meth)acrylate (B-1-1), 10 parts by weight of 1-[9-ethyl-6-(2-methyl-benzoyl)-9H-carbazol-3-yl]-ethylketone-1-(O-acetyloxime) (C-1), 3 parts by weight of bis(2-diphenylphosphinoethyl)-methylsilyethyltriethoxysilane (E-1-1), and 50 parts by weight of titanium oxide (the average particle size of 13.14 nm; F-1) were added into 500 parts by weight of propylene glycol monomethyl ether acetate (D-1) and stirred by a shaking agitator uniformly, so as to form the photosensitive resin composition of Example 1.

Examples 2 to 11 and Comparative Examples 1 to 3

Examples 2 to 11 and comparative examples 1 to 3 use the same method of forming the photosensitive resin composition as the example 1. However, types and amounts of the components of the examples 2 to 11 and the comparative examples 1 to 3 are changed, and detailed conditions as well as an evaluation result are shown in Table 1.

EVALUATION METHOD

1. Refractivity

The photosensitive resin compositions of the examples and comparative examples were spin-coated on a glass substrate (100 mm×100 mm×0.7 mm) with a thickness of 2 μm. The films were pre-baked at a temperature of 90° C. for 2 minutes. A photoresist mask was placed between an exposure machine and the coated films, and the films were exposed to the UV light with energy of 100 mJ/cm². The exposed films were then immersed in the 0.045% of KOH solution for 50 seconds at 23° C. to remove an unexposed portion. After washed by water, the developed film was pre-baked at 235° C. for 30 minutes to form the desired film.

The refractivity of the film on the glass as mentioned above was assayed by a prism coupler (PC-2010, Metricon Co. Ltd) and a laser with a wavelength of 633 nm at 25° C. in an incubator. Evaluation criteria are as follows.
⊚: refractivity≥1.65;
○: 1.65>refractivity≥1.60;
Δ: 1.60>refractivity≥1.55; and
X: refractivity<1.55.

2. Adhesivity to Mo

The photosensitive resin compositions of the examples and comparative examples were spin-coated on a Mo plated glass substrate (100 mm×100 mm×0.7 mm) with a thickness of 2 μm. The films were pre-baked at a temperature of 90° C. for 2 minutes. A photoresist mask was placed between an exposure machine and the coated films, and the films were exposed to the UV light with energy of 100 mJ/cm². The exposed films were then immersed in the 0.045% of KOH solution for 50 seconds at 23° C. to remove an unexposed portion. After washed by water, the developed film was pre-baked at 235° C. for 30 minutes to form the desired film. According to a cross-hatched of an adhesiveness testing method in a section 8.5.2 of JIS.K5400(1900) 8.5, the pixel color layer was cut to 100 grid patterns by a knife. Next, the grid patterns were adhered by a tape, and then the tape was removed. An evaluation was made according to the residual grid patterns and the following criterion. The less the damaged grid patterns are, the better the adhesivity to Mo is.
⊚: no damaged grid patterns
○: 0%<an amount of damaged grid patterns≤5%;
Δ: 5%<the amount of damaged grid patterns≤35%; and
X: 35%<the amount of damaged grid patterns≤100%.

According to the evaluation result in Table 1, the film formed by the photosensitive resin composition including the silane compound (E-1) has good refractivity and adhesivity to Mo. In addition, the film formed by the photosensitive resin composition including the resin having the unsaturated group (A-1), the compound (B-1) and/or the inorganic particles (F) has good refractivity. Moreover, the film formed by the photosensitive resin composition including the compound (B-1) has good adhesivity to Mo. However, the film formed by the photosensitive resin composition without the silane compound (E-1) has poor refractivity and adhesivity to Mo.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

TABLE 1

| composition (parts by | | | Examples | | | | | | | | | | | | Comparative Examples | | |
|---|---|---|---|---|---|---|---|---|---|---|---|---|---|---|---|---|---|
| | | | 1 | 2 | 3 | 4 | 5 | 6 | 7 | 8 | 9 | 10 | 11 | 1 | 2 | 3 |
| Alkali-soluble (A) | A-1 | A-1-1 | 100 | — | — | 70 | — | — | — | — | 100 | — | — | 100 | — | — |
| | | A-1-2 | — | 100 | — | — | 50 | — | — | — | — | — | — | — | 100 | — |
| | | A-1-3 | — | — | 100 | — | — | 30 | — | — | — | — | — | — | — | — |
| | A-2 | A-2-1 | — | — | — | 30 | — | — | 100 | — | — | 100 | — | — | — | — |
| | | A-2-2 | — | — | — | — | 50 | — | — | 100 | — | — | — | — | — | 100 |
| | | A-2-3 | — | — | — | — | — | 70 | — | — | — | — | 100 | — | — | — |
| Compound having vinyl group (B) | B-1 | B-1-1 | 15 | — | — | — | — | — | — | — | — | — | — | — | — | — |
| | | B-1-2 | — | 30 | — | — | — | — | — | — | — | — | — | — | — | — |
| | | B-1-3 | — | — | 50 | — | — | — | — | — | — | 50 | — | — | — | — |
| | | B-1-4 | — | — | — | 100 | — | — | — | — | — | — | — | — | — | — |
| | B-2 | B-2-1 | — | — | 50 | — | 150 | — | 250 | — | 150 | — | — | 100 | 100 | — |
| | | B-2-2 | — | — | — | — | — | 75 | — | 200 | — | 300 | — | — | — | 100 |
| Photoinitiator (C) | | C-1 | 10 | — | — | — | 10 | — | — | 90 | — | — | 30 | — | 30 | — |
| | | C-2 | — | 15 | — | 5 | 50 | — | 65 | — | 80 | — | — | 50 | — | — |
| | | C-3 | — | — | 20 | 25 | — | 60 | — | — | — | 100 | — | — | — | 50 |
| Solvent (D) | | D-1 | 500 | — | 1100 | 1400 | 800 | — | 2500 | — | 3000 | 1000 | — | 1200 | 1500 | — |
| | | D-2 | — | 700 | — | — | 1000 | 2200 | — | 2800 | — | 200 | 2000 | — | — | 1200 |
| Silane compound (E) | E-1 | E-1-1 | 3 | — | — | — | — | — | 8.5 | — | — | — | 8 | — | — | — |
| | | E-1-2 | — | 1 | — | — | — | — | — | 10 | — | — | — | — | — | — |
| | | E-1-3 | — | — | 5 | — | — | — | — | — | — | — | — | — | — | — |
| | | E-1-4 | — | — | — | 1.5 | — | — | — | — | — | — | — | — | — | — |
| | | E-1-5 | — | — | — | — | 6.5 | — | — | — | 0.8 | — | — | — | — | — |
| | | E-1-6 | — | — | — | — | — | 2 | — | — | — | 10.5 | — | — | — | — |
| | E-2 | E-2-1 | — | — | — | 1 | — | — | — | — | — | — | — | 2 | — | — |
| | | E-2-2 | — | — | — | — | — | — | — | — | 2 | — | — | — | — | 2 |
| Inorganic particles (F) | | F-1 | 50 | — | — | — | — | — | — | — | — | — | — | — | — | — |
| | | F-2 | — | — | 135 | — | — | — | — | 250 | — | — | — | — | — | — |
| | | F-3 | — | — | — | — | — | 75 | — | — | — | — | — | — | — | — |
| Additives (G) | | G-1 | — | 1 | — | — | — | — | — | — | — | — | — | — | — | — |
| | | G-2 | — | — | — | — | — | — | 2 | — | — | — | — | — | — | — |
| Evaluation | | Refractivity | ⊚ | ⊚ | ⊚ | ⊚ | ⊚ | ⊚ | ○ | ⊚ | ○ | ○ | ⊚ | X | X | X |
| | | Adhesivity to Mo | ⊚ | ⊚ | ⊚ | ⊚ | ○ | ○ | ○ | ○ | Δ | Δ | ⊚ | X | X | X |

B-1-1 p-(isopropylphenyl)phenyl (meth)acrylate
B-1-2 m-phenylphenyl acylate
B-1-3 o-phenylphenoxy ethyl acrylate
B-1-4 p-phenylphenoxy ethyl acrylate
B-2-1 dipentaerythritol hexacrylate TABLE 1-continued

|  | Examples | | | | | | | | | | | Comparative Examples | | |
|---|---|---|---|---|---|---|---|---|---|---|---|---|---|---|
| composition (parts by | 1 | 2 | 3 | 4 | 5 | 6 | 7 | 8 | 9 | 10 | 11 | 1 | 2 | 3 |

B-2-2 dipentaerythritol tetraacrylate
C-1 1-[9-ethyl-6-(2-methylbenzoyl)-9H-carbazole-3-yl]-ethyl ketone 1-(O-acetaldoxime)
C-2 1-[4-(phenylthio)phenyl]-octane-1,2-diketone 2-(o-benzoyloxime)
C-3 2-methyl-1-[4-(methylthio)phenyl]-2-morpholino-1-propanone
D-1 propylene glycol methyl ether acetate (PGMEA)
D-2 ethyl 3-ethoxylpropionate
E-1-1 bis(2-diphenylphosphinoethyl)-methylsilyethyltriethoxysilane
E-1-2 [2-(triethoxysilyl)ethyl] diphenyl phosphine
E-1-3 [(diethoxysilylene)di-2,1-ethanediyl]bis[diphenyl phosphine]
E-1-4 [4-dimethyl(1-methylethoxy)sily]phenyl)diphenyl phosphine
E-1-5 [3-(dimethylphenoxysilyl)propyl]diphenyl phosphine
E-1-6 [(ethoxysilylidene)tris(methylene)]tris[diphenyl phosphine]
E-2-1 3-methacryloxypropyl trimethoxysilane
E-2-2 3-mercaptopropyl trimethoxysilane
F-1 TiO$_2$, average particle size: 13.14 nm (manufactured by NanoCMS, Korea)
F-2 ZrO$_2$, average particle size: 17.46 nm (manufactured by Osaka Cement Co., Ltd., Japan)
F-3 ZrO$_2$, average particle size: 13.00 nm (manufactured by Mikuni Color Ltd.)
G-1 SF-8427 (manufactured by Dow Corning Toray Silicone)
G-2 KBM-403 (manufactured by Shin-Etsu Chemical Co., Ltd.)

What is claimed is:

1. A photosensitive resin composition, comprising:
an alkali-soluble resin (A);
a compound having a vinyl unsaturated group (B);
a photoinitiator (C);
a solvent (D); and
a silane compound (E), wherein the silane compound (E) comprises a silane compound (E-1) having a structure of formula (I)

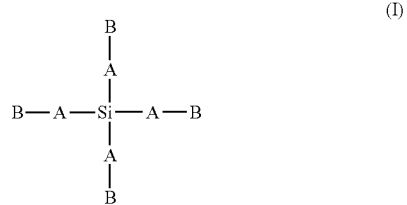

in the formula (I), A individually and independently represents a single bond, an alkylene group or an arylene group, B individually and independently represents an organic group having a diphenyl phosphine group, a hydrogen atom, an alkyl group, an aryl group or —OR, wherein R is an alkyl group of 1 to 6 carbons or a phenyl group,
wherein at least one B is the organic group having the diphenyl phosphine group, at least one B is —OR, and when the B is —OR, the A connected to the B is the single bond.

2. The photosensitive resin composition of claim 1, wherein based on an amount of the alkali-soluble resin (A) as 100 parts by weight, an amount of the compound having a vinyl unsaturated group (B) is 15 parts by weight to 300 parts by weight, an amount of the photoinitiator (C) is 10 parts by weight to 100 parts by weight, an amount of the solvent (D) is 500 parts by weight to 3000 parts by weight, an amount of the silane compound (E) is 1 part by weight to 12 parts by weight, and an amount of the silane compound (E-1) is 1 part by weight to 10 parts by weight.

3. The photosensitive resin composition of claim 1, wherein the alkali-soluble resin (A) comprises a resin having an unsaturated group (A-1) which is obtained by polymerizing a mixture, wherein said mixture comprises an epoxy compound having at least two epoxy groups (a-1-1) and a compound having at least one carboxyl group and at least one vinyl unsaturated group (a-1-2).

4. The photosensitive resin composition of claim 3, wherein the epoxy compound having at least two epoxy group (a-1-1) has a structure of formula (a-I) and/or formula (a-II):

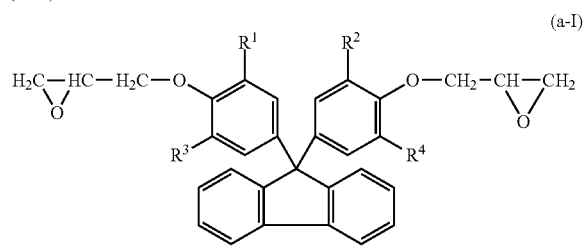

in the formula (a-I), R$^1$, R$^2$, R$^3$ and R$^4$ individually and independently represent a hydrogen atom, a halogen atom, an alkyl group of 1 to 5 carbons, an alkoxy group of 1 to 5 carbons, an aryl group of 6 to 12 carbons or an aralkyl group of 6 to 12 carbons;

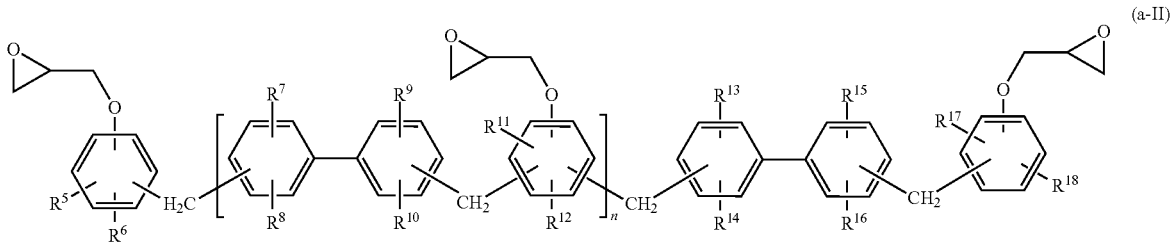

in formula (a-II), $R^5$ to $R^{18}$ are individually and independently represent a hydrogen atom, a halogen atom, an alkyl group of 1 to 8 carbons, an aryl group of 6 to 15 carbons, and n represents an integer from 0 to 10.

5. The photosensitive resin composition of claim 1, wherein the compound having a vinyl unsaturated group (B) comprises a compound (B-1) having a structure of formula (b-I) and/or formula (b-II):

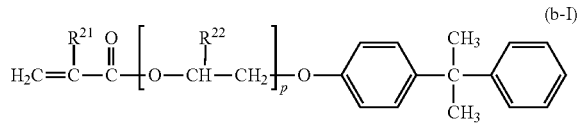

(b-I)

in the formula (b-I), $R^{21}$ and $R^{22}$ individually and independently represent a hydrogen atom or a methyl group, and p represents a number of 0 to 4,

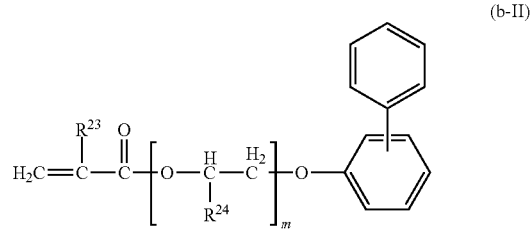

(b-II)

in the formula (b-II), $R^{23}$ and $R^{24}$ individually and independently represent a hydrogen atom or a methyl group, and m represents a number of 0 to 4.

6. The photosensitive resin composition of claim 5, wherein based on the amount of the alkali-soluble resin (A) as 100 parts by weight, an amount of the compound (B-I) is 15 parts by weight to 100 parts by weight.

7. The photosensitive resin composition of claim 1, further comprising an inorganic particle (F), wherein a material of the inorganic particle (F) includes an oxide of a group IV element.

8. The photosensitive resin composition of claim 7, wherein based on the amount of the alkali-soluble resin (A) as 100 parts by weight, an amount of the inorganic particle (F) is 50 parts by weight to 250 parts by weight.

9. A film, formed by coating a photosensitive resin composition of claim 1 on a substrate, and subjecting the substrate to a pre-bake treatment, an exposing treatment, a developing treatment and a post-bake treatment.

10. A device comprising a film of claim 9.

* * * * *